(12) United States Patent
Nakasaki

(10) Patent No.: US 9,484,324 B2
(45) Date of Patent: Nov. 1, 2016

(54) METHOD OF MANUFACTURING SEMICONDUCTOR DEVICE

(71) Applicant: ROHM CO., LTD., Kyoto (JP)

(72) Inventor: Toshio Nakasaki, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 46 days.

(21) Appl. No.: 14/340,665

(22) Filed: Jul. 25, 2014

(65) Prior Publication Data

US 2014/0335659 A1    Nov. 13, 2014

Related U.S. Application Data

(62) Division of application No. 13/275,430, filed on Oct. 18, 2011, now Pat. No. 8,823,155.

(30) Foreign Application Priority Data

Oct. 19, 2010    (JP) .................. 2010-234689

(51) Int. Cl.
*H01L 23/00*    (2006.01)
*H01L 21/764*    (2006.01)
(Continued)

(52) U.S. Cl.
CPC ........... *H01L 24/97* (2013.01); *H01L 21/3043* (2013.01); *H01L 21/6836* (2013.01); *H01L 21/764* (2013.01); *H01L 21/76224* (2013.01); *H01L 21/76898* (2013.01);
(Continued)

(58) Field of Classification Search
CPC ............. H01L 21/3043; H01L 21/76224; H01L 2224/97; H01L 23/3114; H01L 23/3121; H01L 23/481; H01L 23/552; H01L 2924/3025; H01L 2924/16251; H01L 24/94; H01L 24/97; H01L 33/0079; H01L 2224/73265; H01L 21/764; H01L 21/78; H01L 2221/68327; H01L 2924/00; H01L 2221/6834; H05K 1/185
USPC ........ 257/659, 702, 704, 710; 438/113, 424, 438/400, 619
See application file for complete search history.

(56) References Cited

U.S. PATENT DOCUMENTS 5,157,001 A * 10/1992 Sakuma ................. H01L 21/302
257/E21.214
5,399,898 A * 3/1995 Rostoker ...................... 257/499
(Continued)

FOREIGN PATENT DOCUMENTS

JP    2010-045321    2/2010

*Primary Examiner* — Dale E Page
*Assistant Examiner* — John Bodnar
(74) *Attorney, Agent, or Firm* — Hamre, Schumann, Mueller & Larson, P.C.

(57) ABSTRACT

A semiconductor device includes a first semiconductor chip including a first surface, a second surface and a first terminal arranged on the first surface, a second semiconductor chip including a first surface, a second surface and a second terminal arranged on the first surface of the second semiconductor chip, a support substrate including a first surface bonded to the second surfaces of the first semiconductor chip and the second semiconductor chip, and an isolation groove formed on the first surface of the support substrate. The isolation includes a pair of side surfaces continuously extending from opposing side surfaces of the first semiconductor chip and the second semiconductor chip, respectively, and the isolation groove is formed into the support substrate to extend from the first surface of the support substrate. The isolation groove has a depth less than a thickness of the support substrate.

20 Claims, 17 Drawing Sheets

(51) Int. Cl.
*H01L 21/304* (2006.01)
*H01L 21/78* (2006.01)
*H01L 21/786* (2006.01)
*H01L 21/683* (2006.01)
*H01L 21/768* (2006.01)
*H01L 23/48* (2006.01)
*H01L 25/18* (2006.01)
*H01L 21/762* (2006.01)

(52) U.S. Cl.
CPC ............ H01L 21/78 (2013.01); H01L 21/786 (2013.01); H01L 23/481 (2013.01); H01L 25/18 (2013.01); *H01L 24/02* (2013.01); *H01L 24/05* (2013.01); *H01L 24/06* (2013.01); *H01L 24/13* (2013.01); *H01L 24/14* (2013.01); *H01L 24/16* (2013.01); *H01L 24/27* (2013.01); *H01L 24/29* (2013.01); *H01L 24/32* (2013.01); *H01L 24/81* (2013.01); *H01L 2221/68327* (2013.01); *H01L 2224/0239* (2013.01); *H01L 2224/02313* (2013.01); *H01L 2224/02371* (2013.01); *H01L 2224/02372* (2013.01); *H01L 2224/0401* (2013.01); *H01L 2224/056* (2013.01); *H01L 2224/05008* (2013.01); *H01L 2224/06131* (2013.01); *H01L 2224/13022* (2013.01); *H01L 2224/13024* (2013.01); *H01L 2224/13025* (2013.01); *H01L 2224/1412* (2013.01); *H01L 2224/16225* (2013.01); *H01L 2224/16227* (2013.01); *H01L 2224/32225* (2013.01); *H01L 2224/81191* (2013.01); *H01L 2224/81815* (2013.01); *H01L 2224/8385* (2013.01); *H01L 2224/83191* (2013.01); *H01L 2224/83201* (2013.01); *H01L 2924/01019* (2013.01); *H01L 2924/1306* (2013.01); *H01L 2924/13091* (2013.01)

(56) References Cited

U.S. PATENT DOCUMENTS

| | | |
|---|---|---|
| 5,982,015 A | 11/1999 | Hirayama et al. |
| 2001/0016369 A1 | 8/2001 | Zandman et al. |
| 2004/0245649 A1* | 12/2004 | Imaoka ................. H01L 25/167 257/774 |
| 2005/0101117 A1* | 5/2005 | Ozawa ................. H01L 23/522 438/622 |
| 2006/0220214 A1* | 10/2006 | Ando .................... H01L 21/78 257/690 |
| 2007/0228541 A1 | 10/2007 | Lin et al. |
| 2007/0289771 A1 | 12/2007 | Osaka et al. |
| 2009/0212438 A1* | 8/2009 | Kreupl ............. H01L 21/76898 257/773 |

* cited by examiner

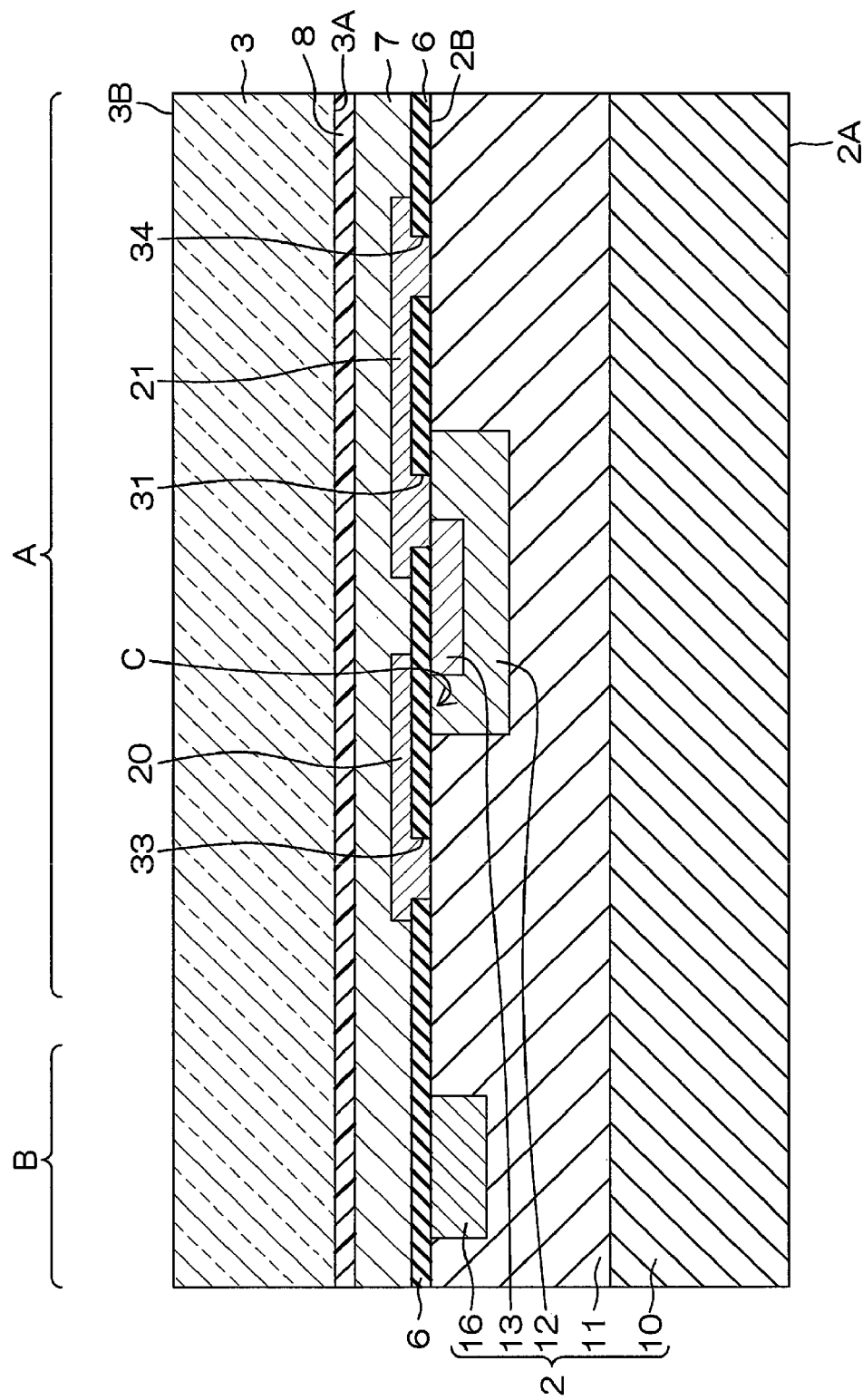

METHOD OF MANUFACTURING SEMICONDUCTOR DEVICE

CROSS-REFERENCE TO RELATED APPLICATION

This application is a Division of application Ser. No. 13/275,430, filed Oct. 18, 2011, which is based upon and claims the benefit of priority from Japanese Patent Application No. 2010-234689, filed on Oct. 19, 2010, the entire contents of which are incorporated herein by reference.

TECHNICAL FIELD

The present disclosure relates to a semiconductor device including a semiconductor chip and a support substrate for supporting the semiconductor chip, and a method of manufacturing the semiconductor device.

BACKGROUND

Japanese Patent Laid-Open Publication No. 2010-45321A discloses a semiconductor device including a semiconductor substrate (or a semiconductor chip), a support substrate bonded to the front surface of the semiconductor substrate and external connection electrodes arranged on the rear surface of the semiconductor substrate. Circuit elements are incorporated into the front surface of the semiconductor substrate. The circuit elements and the external connection electrodes are electrically connected by conductor portions extending through the semiconductor substrate. A process for manufacturing the semiconductor device includes a step of bonding the support substrate to the front surface of the semiconductor substrate, a step of forming through-holes in the semiconductor substrate, a step of forming the conductor portions in the through-holes and arranging the external connection electrodes on the rear surface of the semiconductor substrate and a step of simultaneously dicing the support substrate and the semiconductor substrate into individual semiconductor devices. A semiconductor device having a so-called chip size package shape is obtained through the process noted above.

In the chip-size-package semiconductor device, the cut surfaces of the semiconductor substrate are exposed on the side surfaces thereof. For that reason, when a plurality of chip-size-package semiconductor devices are arranged on a mounting substrate, consideration needs to be given to the possible misalignment of the semiconductor devices in a mounting process and a great enough gap needs to be left between the adjoining semiconductor devices to prevent a short circuit from occurring between the semiconductor devices. Thus, it is sometimes not possible to sufficiently increase the mounting density.

In the meantime, if transistor elements incorporated into a semiconductor wafer are bipolar elements, the semiconductor wafer becomes a common collector. If the transistor elements are unipolar elements, the semiconductor wafer becomes a common drain. By cutting the semiconductor wafer into an area containing a plurality of transistor elements, it is therefore possible to arrange the transistor elements at an increased density.

In an electronic circuit including a plurality of transistor elements, there are few instances where connections need to be made between collectors or between drains. Actually, there are many instances where a connection needs to be made between emitters of transistors, between sources of transistors, between a base and a collector of transistors or between a gate and a drain of transistors. For that reason, even if a semiconductor device is configured without isolating the transistor elements incorporated into a semiconductor wafer, the semiconductor device lacks versatility. In actual cases, the transistor elements incorporated into the semiconductor wafer are divided into individual semiconductor chips. Accordingly, it is necessary to leave room for free connection of the transistor elements. This holds true in other semiconductor function elements such as diode elements.

SUMMARY

In view of the problems above, the present disclosure provides a semiconductor device capable of realizing high-density mounting without impairing the versatility of individual semiconductor function elements and a method of manufacturing the semiconductor device.

A semiconductor device according to one embodiment of the present disclosure includes: a first semiconductor chip including a first surface, a second surface and a first terminal arranged on the first surface; a second semiconductor chip including a first surface, a second surface and a second terminal arranged on the first surface of the second semiconductor chip; a support substrate including a first surface bonded to the second surfaces of the first semiconductor chip and the second semiconductor chip; and an isolation groove formed on the first surface of the support substrate, wherein the isolation groove includes a pair of side surfaces continuously extending from opposing side surfaces of the first semiconductor chip and the second semiconductor chip, respectively, and the isolation groove is formed into the support substrate to extend from the first surface of the support substrate and has a depth less than a depth of the support substrate.

With this configuration, the first and second semiconductor chips are all supported on the support substrate. The first and second semiconductor chips are respectively provided with the first terminal and the second terminal on the surfaces opposite to the support substrate. Accordingly, the semiconductor device can be flip-chip connected to the mounting wiring substrate by causing the first terminal and the second terminal to face the mounting wiring substrate.

On the surface of the support substrate supporting the first and second semiconductor chips, there are formed the isolation groove having a pair of side surfaces continuously extending from mutually-opposing side surfaces of the first and second semiconductor chips. The isolation groove is formed through, e.g., a dicing process in which the first and second semiconductor chips are diced from a common semiconductor substrate (semiconductor wafer). More specifically, the first and second semiconductor chips can be isolated from each other by dicing the semiconductor substrate with the dicing blade in a state that the semiconductor substrate is supported on the support substrate. At this time, the dicing blade is moved to reach an intermediate position of the support substrate in a thickness direction, thereby forming the isolation groove. The first and second semiconductor chips are supported on the support substrate in a state that they are spaced apart from each other by a distance equal to the width of the isolation groove (or the width of the dicing blade). Accordingly, the first and second semiconductor chips are supported on the support substrate in a state that they are reliably isolated from each other by a reduced distance. This makes it possible to mount the first and second semiconductor chips to a mounting wiring substrate in an extremely close relationship while keeping them isolated from each other. As a consequence, the circuit elements (semiconductor function elements) included in the first and second semiconductor chips can be mounted with high density.

The semiconductor device may in some embodiments have a chip size package shape with the side surfaces of the first and second semiconductor chips not encapsulated by a resin. More specifically, a resin for encapsulating the mutually-opposing side surfaces of the first and second semiconductor chips may not be provided in the semiconductor device.

In one embodiment of the present disclosure, the semiconductor device may further include a wiring line formed in the support substrate to electrically interconnect the first semiconductor chip and the second semiconductor chip.

With this configuration, the first and second semiconductor chips can be electrically connected to each other by the wiring line arranged in the support substrate. The wiring line can be designed regardless of the structure of a semiconductor wafer used in manufacturing the first and second semiconductor chips. This enables free connection of the first and second semiconductor chips. More specifically, if transistor elements each having a collector, an emitter and a base are respectively formed in the first and second semiconductor chips, it is possible to make a connection, e.g., between the collectors, between the emitters, between the collector and the emitter and between the collector and the base. Similarly, if transistor elements each having a drain, a source and a gate are respectively formed in the first and second semiconductor chips, it is possible to make connection, e.g., between the drains, between the sources, between the drain and the source and between the drain and the gate.

A method of manufacturing a semiconductor device according to another aspect of the present disclosure includes providing a semiconductor substrate having a first surface and a second surface and a support substrate having a first surface and bonding the second surface of the semiconductor substrate to the first surface of the support substrate; and cutting the semiconductor substrate from the first surface of the semiconductor substrate and forming an isolation groove on the first surface of the support substrate, wherein the isolation groove is cut to extend from the first surface of the support substrate into the support substrate, and the isolation groove has a predetermined depth less than a thickness of the support substrate.

BRIEF DESCRIPTION OF THE DRAWINGS

FIG. 6B is a schematic section view illustrating a step after the step illustrated in FIG. 6A.

DETAILED DESCRIPTION

Embodiments of the present disclosure will now be described in detail with reference to the accompanying drawings.

Figure 1:
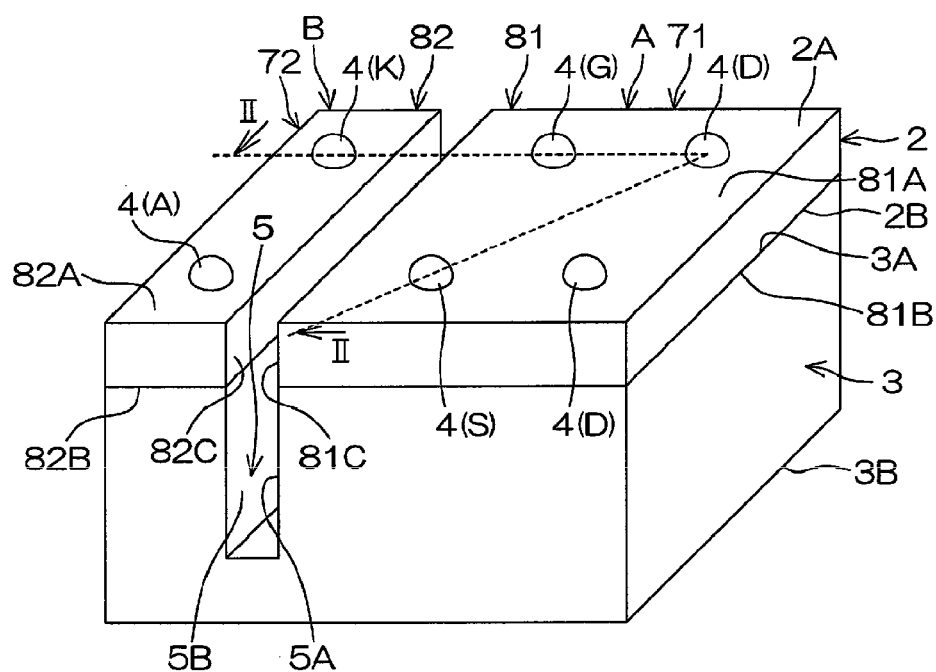
FIG. 1 is a schematic perspective view showing a semiconductor device according to one embodiment of the present disclosure.
Figure 2:
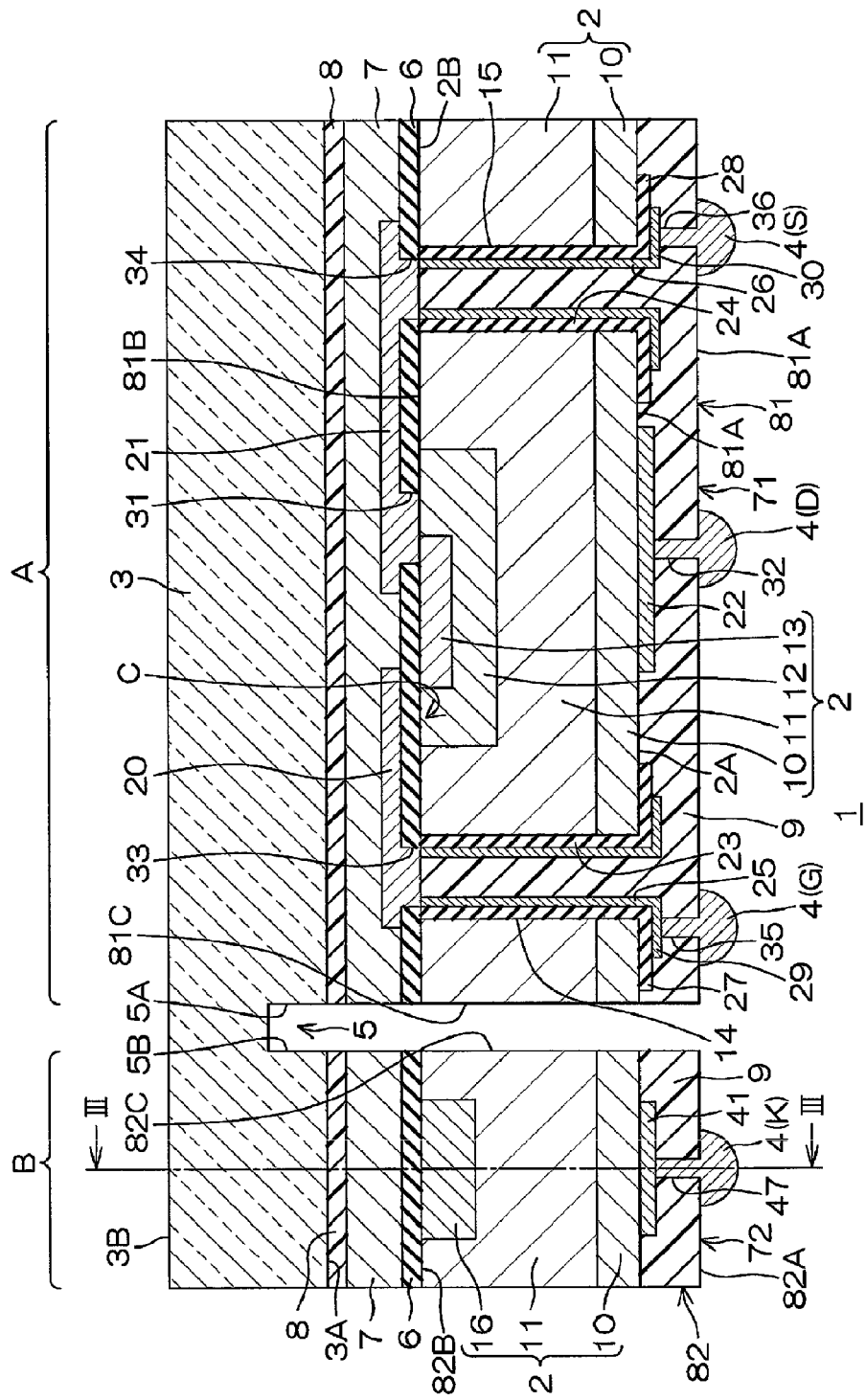
FIG. 2 is a section view of the semiconductor device taken along line II-II in FIG. 1.
Figure 3:
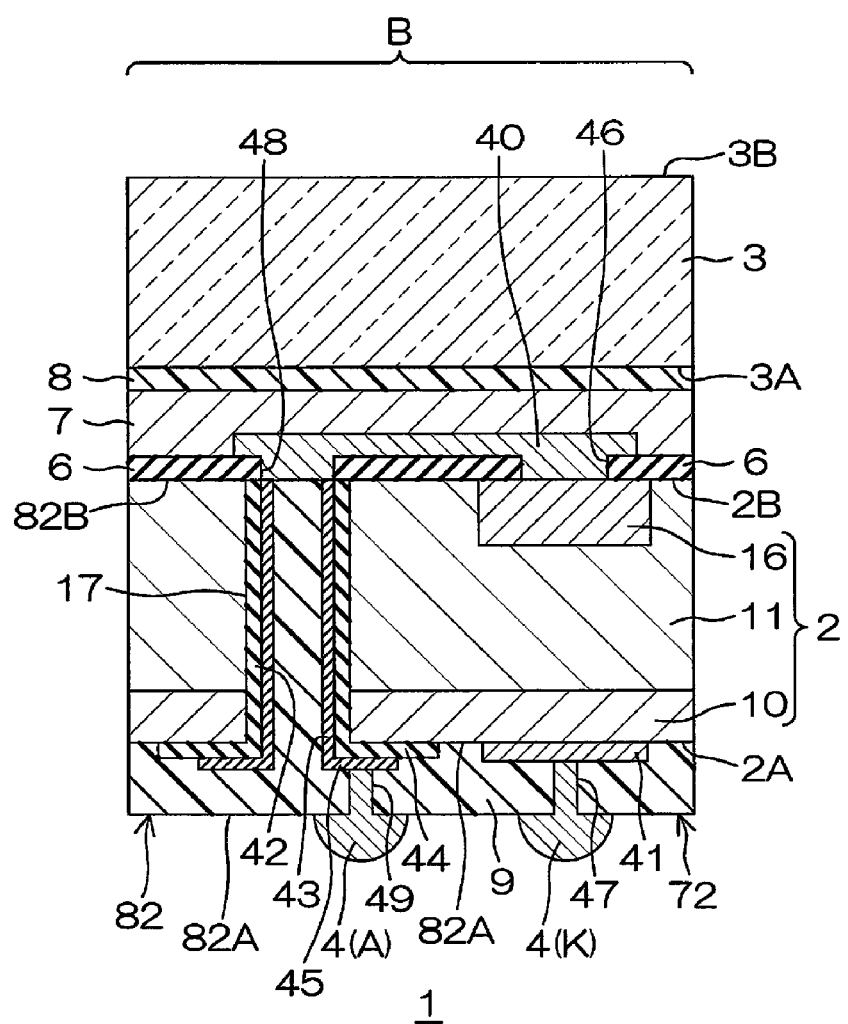
FIG. 3 is a section view of the semiconductor device taken along line III-III in FIG. 2.

FIG. 1 is a schematic perspective view showing a semiconductor device according to one embodiment of the present disclosure. FIG. 2 is a section view of the semiconductor device taken along line II-II in FIG. 1. FIG. 3 is a section view of the semiconductor device taken along line III-III in FIG. 2. The semiconductor device 1 includes a plurality of semiconductor function elements. In the configuration shown in FIGS. 1 to 3, the semiconductor device 1 includes, as the semiconductor function elements, a transistor element 71 and a diode element 72.

Referring to FIG. 1, the semiconductor device 1 as a whole has a generally rectangular parallelepiped shape. The semiconductor device 1 includes a semiconductor substrate 2, a support substrate 3 and terminals 4. The semiconductor substrate 2 is made of, e.g., silicon (Si). The support substrate 3 is made of, e.g., glass. The terminals 4 are bumps made of, e.g., solder. The semiconductor substrate 2 includes a rear surface 2A and a front surface 2B. The support substrate 3 includes a rear surface 3A and a front surface 3B. The rear surface 2A of the semiconductor substrate 2 makes up an upper surface of the semiconductor device 1 shown in FIG. 1. The front surface 2B of the semiconductor substrate 2 is bonded to the rear surface 3A of the support substrate 3. The front surface 3B of the support substrate 3 makes up a lower surface of the semiconductor device 1 shown in FIG. 1.

In the semiconductor device 1, an isolation groove 5 is formed on the rear surface 3A of the support substrate 3. The isolation groove 5 is dug from the rear surface 2A of the semiconductor substrate 2 to cut the semiconductor substrate 2. The isolation groove 5 extends from the rear surface 3A of the support substrate 3 to an intermediate position of the support substrate 3 in a thickness direction. The isolation groove 5 extends rectilinearly along a direction orthogonal to the depth direction thereof to pass through the semiconductor device 1.

As shown in FIG. 1, the semiconductor substrate 2 and a portion of the support substrate 3 are divided by the isolation groove 5 into a transistor region A existing at the right side of the isolation groove 5 and a diode region B existing at the left side of the isolation groove 5. The transistor element 71 is formed in the transistor region A. The diode element 72 is formed in the diode region B.

The rear surface 2A of the semiconductor substrate 2 in the transistor region A has, e.g., a generally rectangular shape. The terminals 4 are respectively provided near the four corners of the rear surface 2A to protrude from the rear surface 2A. In other words, four terminals 4 in total are provided on the rear surface 2A in the transistor region A. Among the four terminals 4, the terminal 4 lying in the left back position in FIG. 1 is a gate terminal 4(G). The gate terminal 4(G) is provided to be connected to the below-mentioned gate electrode 20 (see FIG. 2). The two terminals 4 lying in the right positions in FIG. 1 are drain terminals 4(D). The drain terminals 4(D) are provided to be connected to the below-mentioned drain electrodes 22 (see FIG. 2). The terminal 4 lying in the left forward position in FIG. 1 is a source terminal 4(S). The source terminal 4(S) is provided to be connected to the below-mentioned source electrode 21 (see FIG. 2).

The rear surface 2A of the semiconductor substrate 2 in the diode region B is smaller in area than the rear surface 2A in the transistor region A and has an elongated rectangular shape. The terminals 4 are respectively provided near longitudinal opposite ends of the rear surface 2A of the semiconductor substrate 2 in the diode region B to protrude from the rear surface 2A. In other words, two terminals 4 in total are provided on the rear surface 2A in the diode region B. Among the two terminals 4, the terminal 4 lying in the forward position in FIG. 1 is an anode terminal 4(A). The anode terminal 4(A) is provided to be connected to the below-mentioned anode electrode 40 (see FIG. 3). The terminal 4 lying in the back position in FIG. 1 is a cathode terminal 4(K). The cathode terminal 4(K) is provided to be connected to the below-mentioned cathode electrode 41 (see FIG. 3).

In FIG. 2, the vertical orientation of the semiconductor device 1 is opposite to that shown in FIG. 1. For the sake of convenience in description, the support substrate 3 is shown to have a thickness smaller than an actual thickness. Referring to FIG. 2, the semiconductor device 1 further includes an oxide film 6, a protective layer 7, a bonding layer 8 and a rear insulating layer 9, in addition to the semiconductor substrate 2, the support substrate 3 and the terminals 4. The oxide film 6 is made of, e.g., silicon oxide ($SiO_2$), and covers the front surface 2B of the semiconductor substrate 2. The protective layer 7 is made of, e.g., silicon nitride (SiN), and is formed on the oxide film 6. The bonding layer 8 is formed on the protective layer 7. The support substrate 3 is placed on the bonding layer 8, and the bonding layer 8 bonds the protective layer 7 on the semiconductor substrate 2 and the support substrate 3 together. The rear insulating layer 9 is formed on the rear surface 2A of the semiconductor substrate 2. In FIG. 1, the oxide film 6, the protective layer 7, the bonding layer 8 and the rear insulating layer 9 are not shown.

In both the transistor region A and the diode region B, the semiconductor substrate 2 includes an $n^+$ type semiconductor layer 10 and an $n^-$ type semiconductor layer 11 laminated on the $n^+$ type semiconductor layer 10. The rear surface of the $n^+$ type semiconductor layer 10 makes up the rear surface 2A of the semiconductor substrate 2. The front surface of the $n^-$ type semiconductor layer 11 makes up the front surface 2B of the semiconductor substrate 2. In the transistor region A, the semiconductor substrate 2 further includes a p type semiconductor layer 12 and an n type semiconductor layer 13. The p type semiconductor layer 12 is formed in the surface layer portion of the $n^-$ type semiconductor layer 11. The n type semiconductor layer 13 is formed in the surface layer portion of the p type semiconductor layer 12. The surfaces of the p type semiconductor layer 12, the n type semiconductor layer 13 and the $n^-$ type semiconductor layer 11 are flush with one another and make up the front surface 2B of the semiconductor substrate 2.

In the semiconductor substrate 2 of the transistor region A, through-holes 14 and 15 are formed in the positions deviating from the p type semiconductor layer 12 and the n type semiconductor layer 13. The through-holes 14 and 15 have, e.g., a circular cross-sectional shape, and are formed into a cylindrical shape to pass through the semiconductor substrate 2 in the thickness direction thereof.

In the diode region B, the semiconductor substrate 2 includes a p type semiconductor layer 16. The p type semiconductor layer 16 is formed in the surface layer portion of the $n^-$ type semiconductor layer 11. The surfaces of the p type semiconductor layer 16 and the $n^-$ type semiconductor layer 11 are flush with each other and make up the front surface 2B of the semiconductor substrate 2.

In the semiconductor substrate 2 of the diode region B, a through-hole 17 is formed in the position deviating from the p type semiconductor layer 16 (see FIG. 3). The through-hole 17 has, e.g., a circular cross-sectional shape, and is formed into a cylindrical shape to pass through the semiconductor substrate 2 in the thickness direction thereof. In the transistor region A, the semiconductor device 1 further includes a gate electrode 20, a source electrode 21, a drain electrode 22, sidewall insulating films 23 and 24, connection electrodes 25 and 26, rear insulating films 27 and 28, and external electrodes 29 and 30.

The gate electrode 20 is made of, e.g., aluminum (Al). The gate electrode 20 is formed on the oxide film 6 to straddle the through-hole 14, the $n^-$ type semiconductor layer 11 and the p type semiconductor layer 12. The gate electrode 20 is interposed between the oxide film 6 and the protective layer 7. The source electrode 21 is made of, e.g., aluminum. The source electrode 21 is formed on the oxide film 6 to straddle the through-hole 15, the $n^-$ type semiconductor layer 11, the p type semiconductor layer 12 and the n type semiconductor layer 13. The source electrode 21 is interposed between the oxide film 6 and the protective layer 7. An opening 31 is formed in a portion of the oxide film 6 straddling the p type semiconductor layer 12 and the n type semiconductor layer 13. The source electrode 21 is connected to the p type semiconductor layer 12 and the n type semiconductor layer 13 through the opening 31.

The drain electrode 22 is made of, e.g., aluminum. The drain electrode 22 is formed on the rear surface of the $n^+$ type semiconductor layer 10 and is connected to the $n^+$ type semiconductor layer 10. The drain electrode 22 is interposed between the $n^+$ type semiconductor layer 10 and the rear insulating layer 9. An opening 32 passing through the rear insulating layer 9 is formed in the portion of the rear insulating layer 9 opposing the rear insulating layer 9. While only a single opening 32 is shown in FIG. 2, two openings in total are formed, in reality, to correspond to the number of the drain terminals 4(D) stated above (see FIG. 1). Each of the drain terminals 4(D) is connected to the drain electrode 22 through the corresponding opening 32. In the transistor region A, therefore, the drain terminals 4(D), the drain electrode 22, the n+ type semiconductor layer 10 and the n− type semiconductor layer 11 are electrically connected to one another.

The sidewall insulating film 23 is made of, e.g., SiO$_2$. The sidewall insulating film 23 is formed in the semiconductor substrate 2 over the entire area of an inner surface defining the through-hole 14 (namely, a circumferential surface of the through-hole 14). The sidewall insulating film 23 has a cylindrical shape. A circular opening 33 slightly smaller in cross section than the through-hole 14 is formed in the portion of the oxide film 6 aligned with the through-hole 14. One end of the sidewall insulating film 23 is connected to the oxide film 6.

The sidewall insulating film 24 is made of, e.g., SiO$_2$. The sidewall insulating film 24 is formed in the semiconductor substrate 2 over the entire area of an inner surface defining the through-hole 15 (namely, a circumferential surface of the through-hole 15). The sidewall insulating film 24 has a cylindrical shape. A circular opening 34 slightly smaller in cross section than the through-hole 15 is formed in the portion of the oxide film 6 aligned with the through-hole 15. One end of the sidewall insulating film 24 is connected to the oxide film 6.

The connection electrode 25 is made of, e.g., titanium (Ti) or alloy of titanium and copper. The connection electrode 25 is formed over the entire area of an inner circumferential surface of the sidewall insulating film 23 (namely, a circumferential surface of the sidewall insulating film 23 not making contact with the semiconductor substrate 2). The connection electrode 25 is formed into a cylindrical shape to extend along the through-hole 14. A portion of the gate electrode 20 is inserted into the opening 33 of the oxide film 6. The connection electrode 25 is connected to the gate electrode 20 in the opening 33.

The connection electrode 26 is made of the same material as the material of the connection electrode 25. The connection electrode 26 is formed over the entire area of an inner circumferential surface of the sidewall insulating film 24 (namely, a circumferential surface of the sidewall insulating film 24 not making contact with the semiconductor substrate 2). The connection electrode 26 is formed into a cylindrical shape to extend along the through-hole 15. A portion of the source electrode 21 is inserted into the opening 34 of the oxide film 6. The connection electrode 26 is connected to the source electrode 21 in the opening 34. The rear insulating film 27 is made of, e.g., SiO$_2$. The rear insulating film 27 is formed on the rear surface 2A of the semiconductor substrate 2 (namely, on the rear surface of the n+ type semiconductor layer 10). The rear insulating film 27 is connected to the sidewall insulating film 23 arranged within the through-hole 14.

The rear insulating film 28 is made of, e.g., SiO$_2$. The rear insulating film 28 is formed on the rear surface 2A of the semiconductor substrate 2. The rear insulating film 28 is connected to the sidewall insulating film 24 arranged within the through-hole 15. The external electrodes 29 and 30 are made of the same material as the material of the connection electrodes 25 and 26. The external electrode 29 is formed on the rear insulating film 27. The external electrode 29 is connected to the connection electrode 25 arranged within the through-hole 14. The external electrode 29 is interposed between the rear insulating film 27 and the rear insulating layer 9. An opening 35 passing through the rear insulating layer 9 is formed in the portion of the rear insulating layer 9 opposing the external electrode 29. The gate terminal 4(G) is connected to the external electrode 29 through the opening 35. Thus, the gate terminal 4(G), the external electrode 29, the connection electrode 25 and the gate electrode 20 are electrically connected to one another.

The external electrode 30 is formed on the rear insulating film 28. The external electrode 30 is connected to the connection electrode 26 arranged within the through-hole 15. The external electrode 30 is interposed between the rear insulating film 28 and the rear insulating layer 9. An opening 36 passing through the rear insulating layer 9 is formed in the portion of the rear insulating layer 9 aligned with the external electrode 30. The source terminal 4(S) is connected to the external electrode 30 through the opening 36. Thus, the source terminal 4(S), the external electrode 30, the connection electrode 26, the source electrode 21, the p type semiconductor layer 12 and the n type semiconductor layer 13 are electrically connected to one another.

Portions of the rear insulating layer 9 are inserted into the cylindrical space surrounded by the connection electrodes 25 and 26 to fill the cylindrical space surrounded by the connection electrodes 25 and 26. In the manner set forth above, the transistor element 71 is formed in the semiconductor substrate 2 of the transistor region A. The portion of the semiconductor substrate 2 formed with the transistor element 71 makes up a first semiconductor chip 81.

The rear surface 2A of the semiconductor substrate 2 in the transistor region A becomes a first surface 81A of the first semiconductor chip 81. More precisely, the rear insulating layer 9 of the transistor region A is also included in the first semiconductor chip 81 and, therefore, the external surface of the rear insulating layer 9 on the rear surface 2A of the semiconductor substrate 2 in the transistor region A becomes the first surface 81A of the first semiconductor chip 81. A plurality of first terminals 4 including the source terminal 4(S), the drain terminals 4(D) and the gate terminal 4(G) are arranged on the first surface 81A.

The front surface 2B of the semiconductor substrate 2 of the transistor region A becomes a second surface 81B of the first semiconductor chip 81 and is bonded to the rear surface 3A of the support substrate 3 through the oxide film 6, the protective layer 7 and the bonding layer 8. In the first semiconductor chip 81, the n− type semiconductor layer 11 becomes a drain region and the n type semiconductor layer 13 becomes a source region. For example, a voltage equal to or greater than a threshold value is applied to the gate electrode 20 (or the gate terminal 4(G)) in a state that a positive voltage is applied to the drain electrode 22 (or the drain terminals 4 (D)) with the source electrode 21 (or the source terminal 4(S)) grounded. Then, just below the gate electrode 20, a channel is formed in a channel region C near the boundary surface of the p type semiconductor layer 12 adjoining the oxide film 6. An electric current flows from the drain electrode 22 toward the source electrode 21 through the channel.

Referring to FIG. 3, the semiconductor device 1 includes an anode electrode 40, a cathode electrode 41, a sidewall insulating film 42, a connection electrode 43, a rear insulating film 44 and an external electrode 45 in the diode region B. The anode electrode 40 is made of, e.g., aluminum. The anode electrode 40 is formed on the oxide film 6 to straddle the through-hole 17 and the p type semiconductor layer 16. The anode electrode 40 is interposed between the oxide film 6 and the protective layer 7. An opening 46 is formed in the portion of the oxide film 6 opposing the p type semiconductor layer 16. The anode electrode 40 is connected to the p type semiconductor layer 16 through the opening 46.

The cathode electrode 41 is made of, e.g., aluminum. The cathode electrode 41 is formed on the rear surface of the n+ type semiconductor layer 10 and connected to the n+ type semiconductor layer 10. The cathode electrode 41 is interposed between the n+ type semiconductor layer 10 and the rear insulating layer 9. An opening 47 passing through the rear insulating layer 9 is formed in the portion of the rear insulating layer 9 opposing the cathode electrode 41. The cathode terminal 4(K) is connected to the cathode electrode 41 through the opening 47. Thus, the cathode terminal 4(K), the cathode electrode 41, the n+ type semiconductor layer 10 and the n− type semiconductor layer 11 are electrically connected to one another.

The sidewall insulating film 42 is made of, e.g., $SiO_2$. The sidewall insulating film 42 is formed in the semiconductor substrate 2 over the entire area of an inner surface defining the through-hole 17 (namely, a circumferential surface of the through-hole 17). The sidewall insulating film 42 has a cylindrical shape. A circular opening 48 slightly smaller in cross section than the through-hole 17 is formed in the portion of the oxide film 6 opposing the through-hole 17. One end of the sidewall insulating film 42 is connected to the oxide film 6.

The connection electrode 43 is made of the same material as the material of the connection electrodes 25 and 26. The connection electrode 43 is formed over the entire area of an inner circumferential surface of the sidewall insulating film 42 (namely, a circumferential surface of the sidewall insulating film 42 not making contact with the semiconductor substrate 2). The connection electrode 43 is formed into a cylindrical shape to extend along the through-hole 17. A portion of the anode electrode 40 is inserted into the opening 48 of the oxide film 6. The connection electrode 43 is connected to the anode electrode 40 in the opening 48. The rear insulating film 44 is made of, e.g., $SiO_2$. The rear insulating film 44 is formed on the rear surface 2A of the semiconductor substrate 2 (namely, on the rear surface of the n+ type semiconductor layer 10). The rear insulating film 44 is connected to the sidewall insulating film 42 arranged within the through-hole 17.

The external electrode 45 is made of the same material as the material of the connection electrode 43. The external electrode 45 is formed on the rear insulating film 44. The external electrode 45 is connected to the connection electrode 43 arranged within the through-hole 17. The external electrode 45 is interposed between the rear insulating film 44 and the rear insulating layer 9. An opening 49 passing through the rear insulating layer 9 is formed in the portion of the rear insulating layer 9 opposing the external electrode 45. The anode terminal 4(A) is connected to the external electrode 45 through the opening 49. Thus, the anode terminal 4(A), the external electrode 45, the connection electrode 43, the anode electrode 40 and the p type semiconductor layer 16 are electrically connected to one another.

A portion of the rear insulating layer 9 is inserted into the cylindrical space surrounded by the connection electrode 43 to fill the inside of the cylindrical space surrounded by the connection electrode 43. In the manner set forth above, the diode element 72 in which an electric current flows between the anode electrode 40 (or the anode terminal 4(A)) and the cathode electrode 41 (or the cathode terminal 4(K)) is formed in the semiconductor substrate 2 of the diode region B. The portion of the semiconductor substrate 2 formed with the diode element 72 makes up a second semiconductor chip 82.

The rear surface 2A of the semiconductor substrate 2 in the diode region B becomes a first surface 82A of the second semiconductor chip 82. More precisely, the rear insulating layer 9 of the diode region B is also included in the second semiconductor chip 82 and, therefore, the external surface of the rear insulating layer 9 on the rear surface 2A of the semiconductor substrate 2 in the diode region B becomes the first surface 82A of the second semiconductor chip 82. A plurality of second terminals 4 including the anode terminal 4(A) and the cathode terminal 4(K) are arranged on the first surface 82A.

The front surface 2B of the semiconductor substrate 2 in the diode region B becomes a second surface 82B of the second semiconductor chip 82 and is bonded to the rear surface 3A of the support substrate 3 through the oxide film 6, the protective layer 7 and the bonding layer 8. As shown in FIG. 2, the isolation groove 5 is positioned between the first semiconductor chip 81 and the second semiconductor chip 82. Mutually-opposing parallel side surfaces of the first semiconductor chip 81 and the second semiconductor chip 82 are referred to as side surfaces 81C and 82C, respectively. The side surfaces 81C and 82C extend parallel to each other with the isolation groove 5 interposed therebetween. The isolation groove 5 has a pair of side surfaces 5A and 5B continuously extending from the side surfaces 81C and 82C, respectively. The side surface 5B continuously extends from the side surface 82C. The side surface 5A continuously extends from the side surface 81C. The side surfaces 5A and 5B extend parallel to each other.

Figure 4:
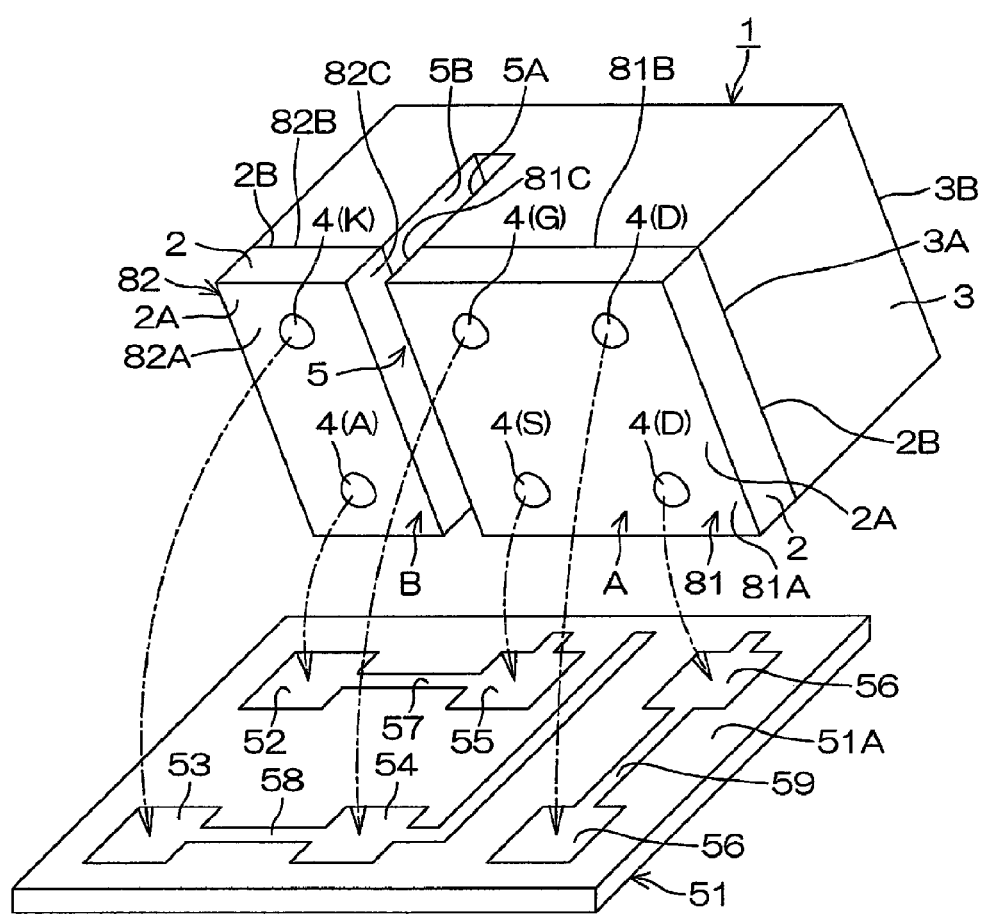
FIG. 4 is a schematic perspective view showing a state in which the semiconductor device is being mounted to a mounting wiring substrate.
Figure 5:
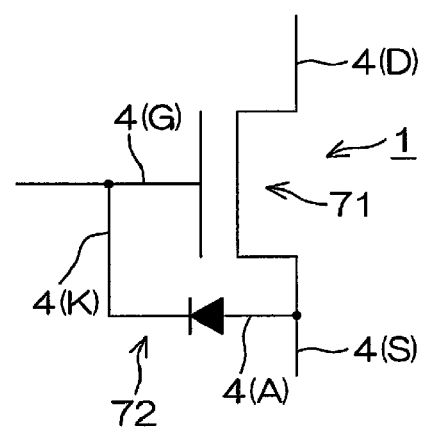
FIG. 5 is an electric circuit diagram depicting the connection relationship between a transistor element and a diode element in the semiconductor device shown in FIG. 2.

FIG. 4 is a schematic perspective view showing a state in which the semiconductor device is being mounted to a mounting wiring substrate. FIG. 5 is an electric circuit diagram depicting the connection relationship between the transistor element and the diode element in the semiconductor device shown in FIG. 2. Steps of mounting the semiconductor device 1 shown in FIGS. 1 to 3 to a mounting wiring substrate 51 will be described with reference to FIG. 4.

An anode-side terminal 52, a cathode-side terminal 53, a gate-side terminal 54, a source-side terminal 55 and two drain-side terminals 56 are provided on a front surface 51A of the mounting wiring substrate 51. The anode-side terminal 52 and the cathode-side terminal 53 are arranged in a corresponding positional relationship with the anode terminal 4(A) and the cathode terminal 4(K) of the semiconductor device 1. The gate-side terminal 54, the source-side terminal 55 and the drain-side terminals 56 are arranged in a corresponding positional relationship with the gate terminal 4(G), the source terminal 4(S) and the drain terminals 4 (D) of the semiconductor device 1.

The anode-side terminal 52 and the source-side terminal 55 are arranged to adjoin each other and are connected to each other through a connection wiring line 57 formed on the mounting wiring substrate 51. The cathode-side terminal 53 and the gate-side terminal 54 are arranged to adjoin each other and are connected to each other through a connection wiring line 58 formed on the mounting wiring substrate 51. The drain-side terminals 56 are connected to each other through a connection wiring line 59.

When mounting the semiconductor device 1 to the mounting wiring substrate 51, the semiconductor device 1 is moved toward the front surface 51A of the mounting wiring substrate 51 while keeping the respective terminals 4 in an opposing relationship with the front surface 51A. If the anode terminal 4(A), the cathode terminal 4(K), the gate terminal 4(G), the source terminal 4(S) and the drain terminals 4 (D) are respectively placed on the anode-side terminal 52, the cathode-side terminal 53, the gate-side terminal 54, the source-side terminal 55 and the drain-side terminals 56, the semiconductor device 1 is supported by the mounting wiring substrate 51. Thereafter, the respective terminals 4 are heated, molten and cooled. The cooled terminals 4 interconnect the semiconductor device 1 and the mounting wiring substrate 51. In this way, the semiconductor device 1 is mounted to the mounting wiring substrate 51.

When the semiconductor device 1 is mounted to the mounting wiring substrate 51, the anode terminal 4(A) and the source terminal 4(S) are electrically connected to each other through the anode-side terminal 52, the connection wiring line 57 and the source-side terminal 55. The cathode terminal 4(K) and the gate terminal 4(G) are electrically connected to each other through the cathode-side terminal 53, the connection wiring line 58 and the gate-side terminal 54.

In other words, if the semiconductor device 1 is mounted on the mounting wiring substrate 51, the transistor element 71 and the diode element 72 of the semiconductor device 1 are electrically connected to each other between the anode terminal 4(A) and the source terminal 4(S) and between the cathode terminal 4(K) and the gate terminal 4(G) as illustrated in FIG. 5. The diode element 72 makes up a protector circuit in which, when an excessive voltage is applied to the gate terminal 4(G) of the transistor element 71, the diode element 72 is broken down to protect the transistor element 71.

Figure 6A:
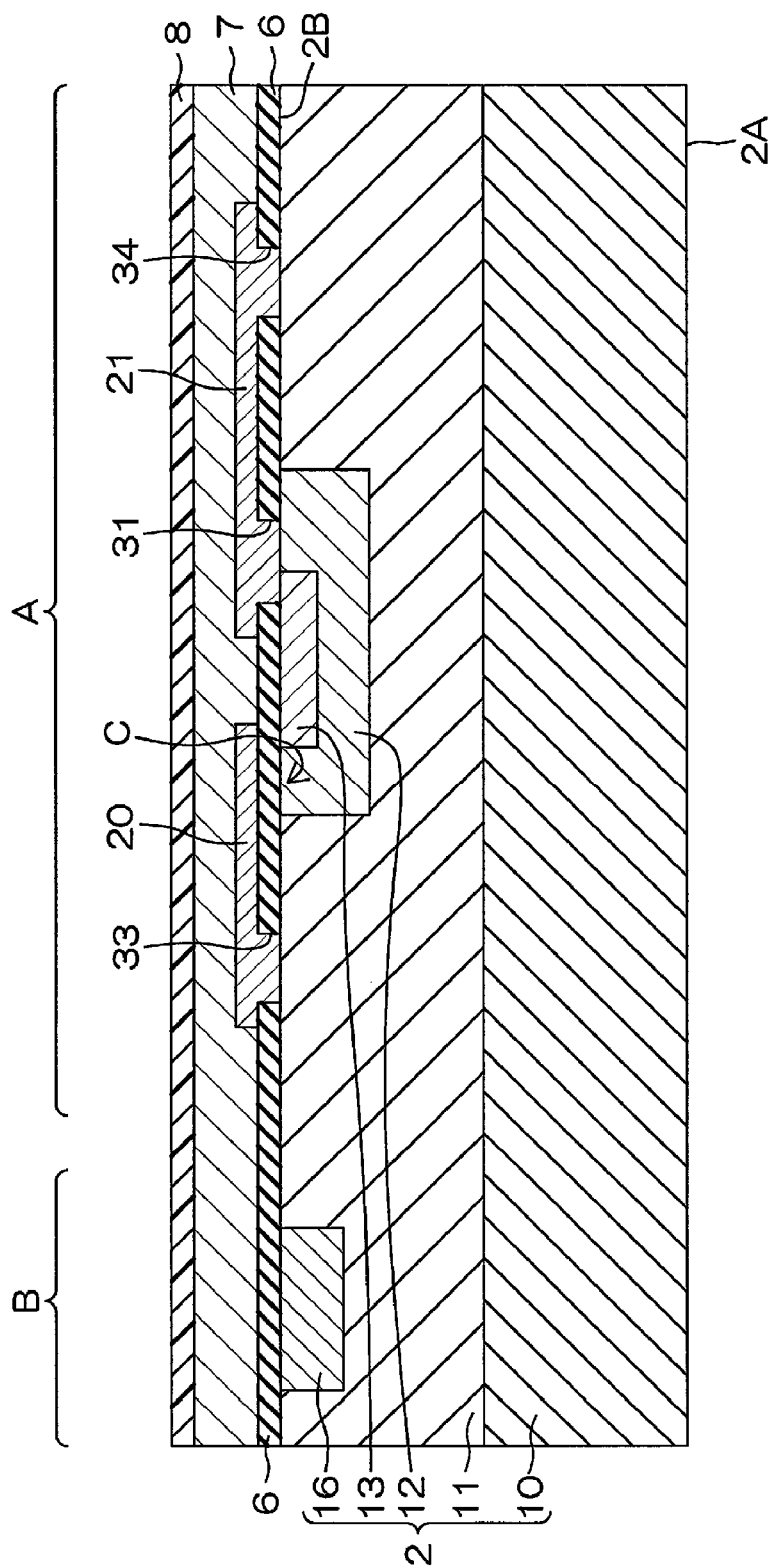
FIG. 6A is a schematic section view illustrating a method of manufacturing the semiconductor device shown in FIG. 2.

FIGS. 6A to 6F are schematic section views illustrating a method of manufacturing the semiconductor device shown in FIG. 2. FIGS. 7A to 7C are perspective views illustrating steps after the step illustrated in FIG. 6F. Referring first to FIG. 6A, the semiconductor substrate 2 is produced according to a method known in the art. In the semiconductor substrate 2, the n⁻ type semiconductor layer 11 is formed on the front surface of the n⁺ type semiconductor layer 10 by epitaxial growing.

Next, the oxide film 6 is formed on the front surface 2B of the semiconductor substrate 2. The openings 31, 33 and 34 are formed in the oxide film 6. Subsequently, the gate electrode 20, the source electrode 21 and the anode electrode 40 (see FIG. 3) are formed on the oxide film 6. Then, the protective layer 7 made of SiN is formed on the oxide film 6 by a CVD (Chemical Vapor Deposition) method.

Next, an adhesive agent is coated on the front surface of the protective layer 7 to form the bonding layer 8. The bonding layer 8 has a thickness of, e.g., about 50 µm. Then, as illustrated in FIG. 6B, the rear surface 3A of the support substrate 3 is pressed against the bonding layer 8 on the protective layer 7 so that the front surface 3B of the support substrate 3 and the protective layer 7 (namely, the front surface 2B of the semiconductor substrate 2) are bonded to each other by the bonding layer 8. The support substrate 3 has a thickness of, e.g., about 400 µm.

Figure 6C:
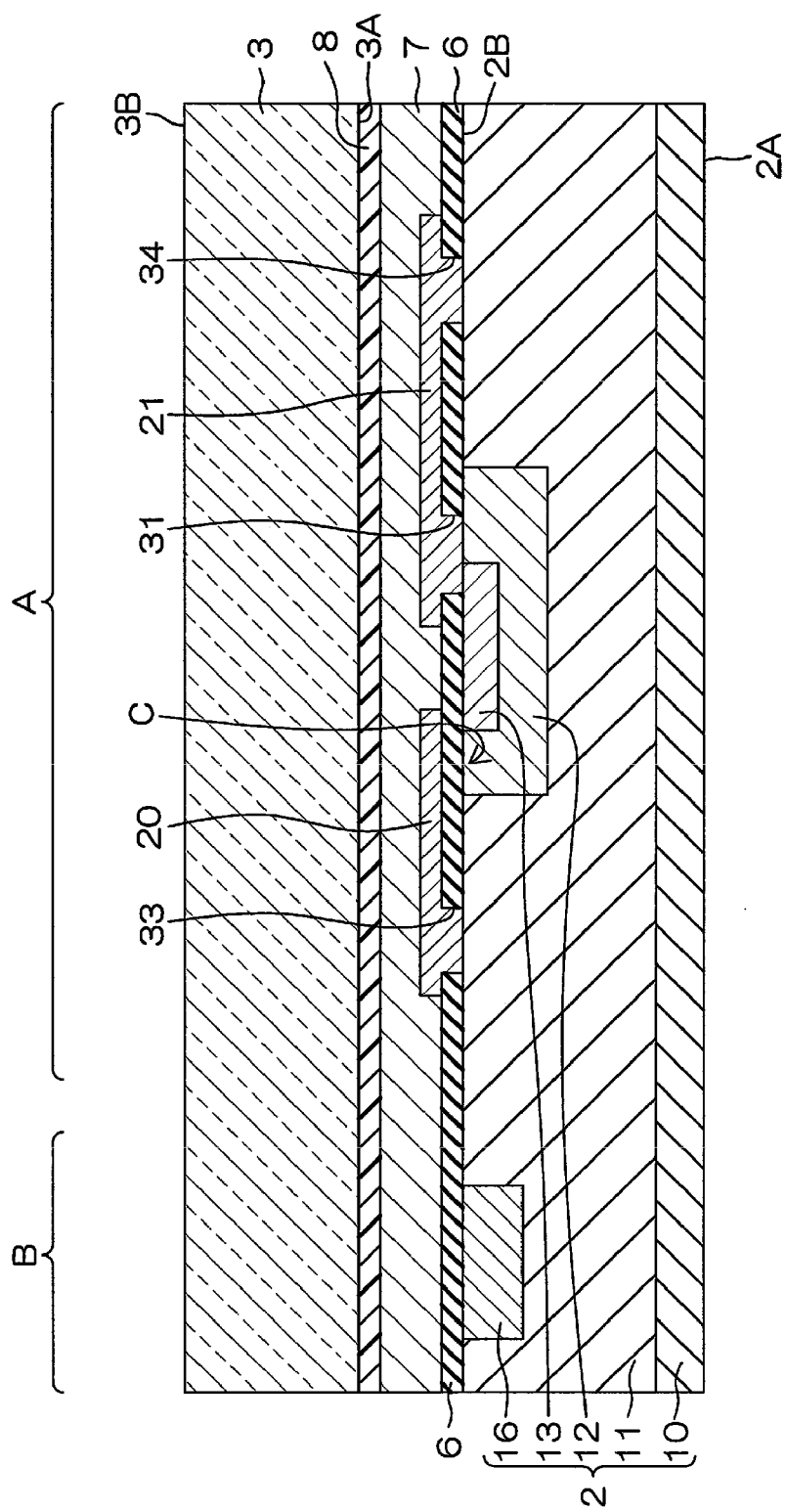
FIG. 6C is a schematic section view illustrating a step after the step illustrated in FIG. 6B.
Figure 6D:
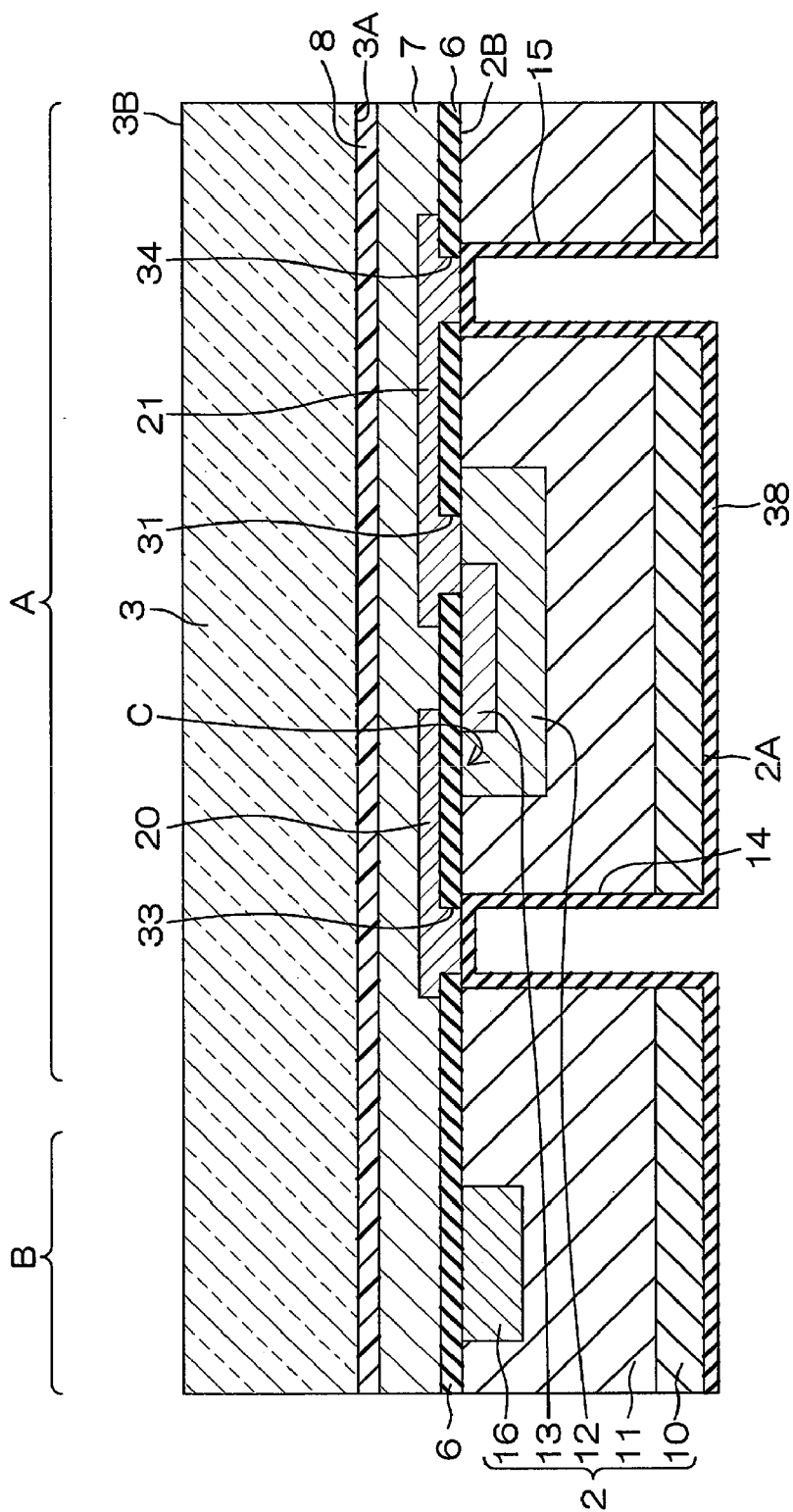
FIG. 6D is a schematic section view illustrating a step after the step illustrated in FIG. 6C.

Next, as illustrated in FIG. 6C, the n⁺ type semiconductor layer 10 of the semiconductor substrate 2 is cut and grinded at the side of the rear surface 2A until the thickness of the semiconductor substrate 2 becomes equal to, e.g., about 100 µm. At this time, the semiconductor substrate 2 is supported by the support substrate 3 bonded thereto. This eliminates the possibility of the semiconductor substrate 2 becoming bent. Then, the semiconductor substrate 2 is partially removed at the side of the front surface 2B by dry etching in which a resist pattern (not shown) is used as a mask. Consequently, as illustrated in FIG. 6D, the through-holes 14, 15 and 17 are formed in the semiconductor substrate 2 (also see FIG. 3). The through-holes 14, 15 and 17 have a diameter of, e.g., about 50 µm. When forming the through-holes 14, 15 and 17, the semiconductor substrate 2 is supported by the support substrate 3 bonded thereto. This eliminates the possibility of the semiconductor substrate 2 being bent. Since the through-holes 14, 15 and 17 are formed to pass through the semiconductor substrate 2, the gate electrode 20, the source electrode 21 and the anode electrode 40 are exposed in the through-hole 14, the through-hole 15 and the through-hole 17, respectively (also see FIG. 3). The through-hole 17 is not shown in FIGS. 6A to 6F.

Next, an oxide film 38 made of SiO₂ is formed on the rear surface 2A of the semiconductor substrate 2 and on the cylindrical inner surfaces of the through-holes 14, 15 and 17 by a CVD method under a temperature condition of, e.g., 180 degrees Celsius. The oxide film 38 is also formed on the surface of the gate electrode 20 exposed in the through-hole 14, the surface of the source electrode 21 exposed in the through-hole 15 and the surface of the anode electrode 40 exposed in the through-hole 17.

Figure 6E:
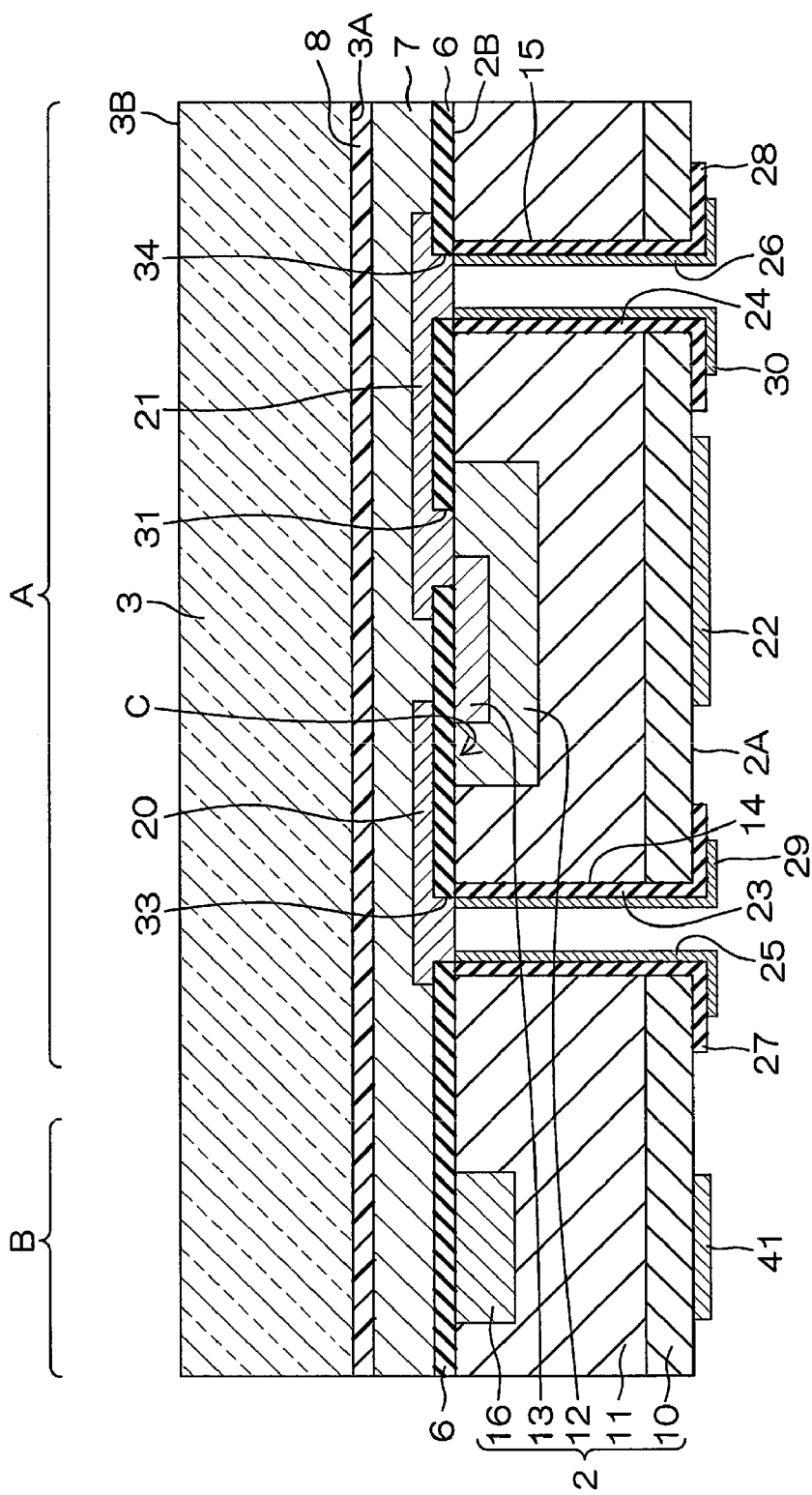
FIG. 6E is a schematic section view illustrating a step after the step illustrated in FIG. 6D.
Figure 7A:
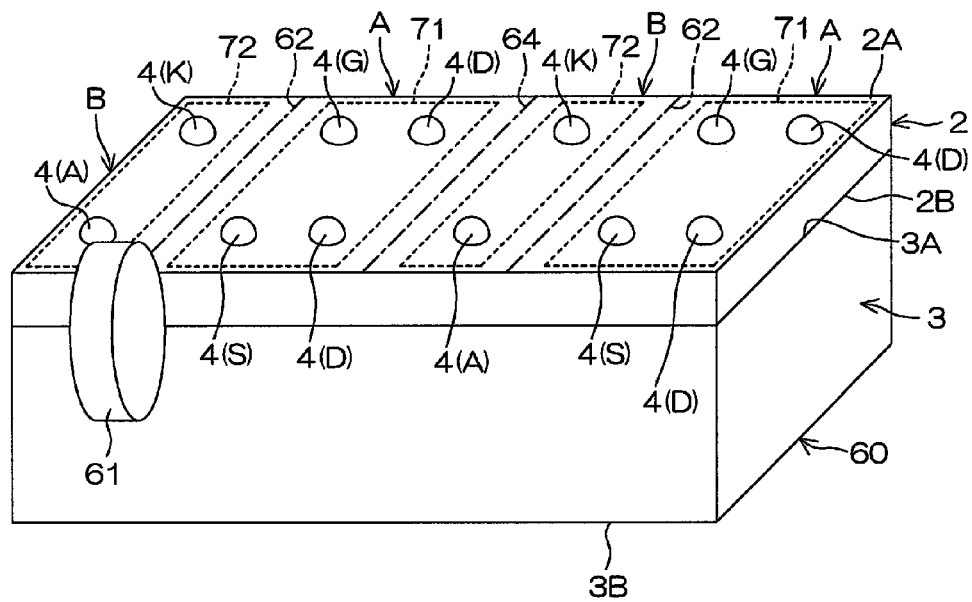
FIG. 7A is a schematic perspective view showing an intermediate product obtained in the step illustrated in FIG. 6F and illustrating a step after the step illustrated in FIG. 6F.
Figure 7B:
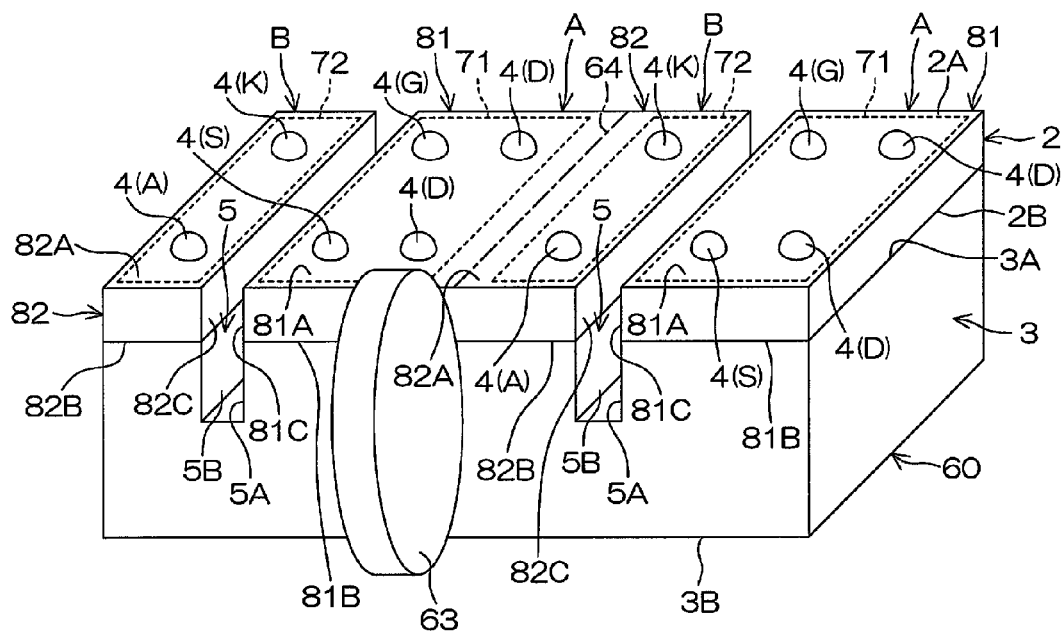
FIG. 7B is a schematic perspective view illustrating a step after the step illustrated in FIG. 7A.
Figure 7C:
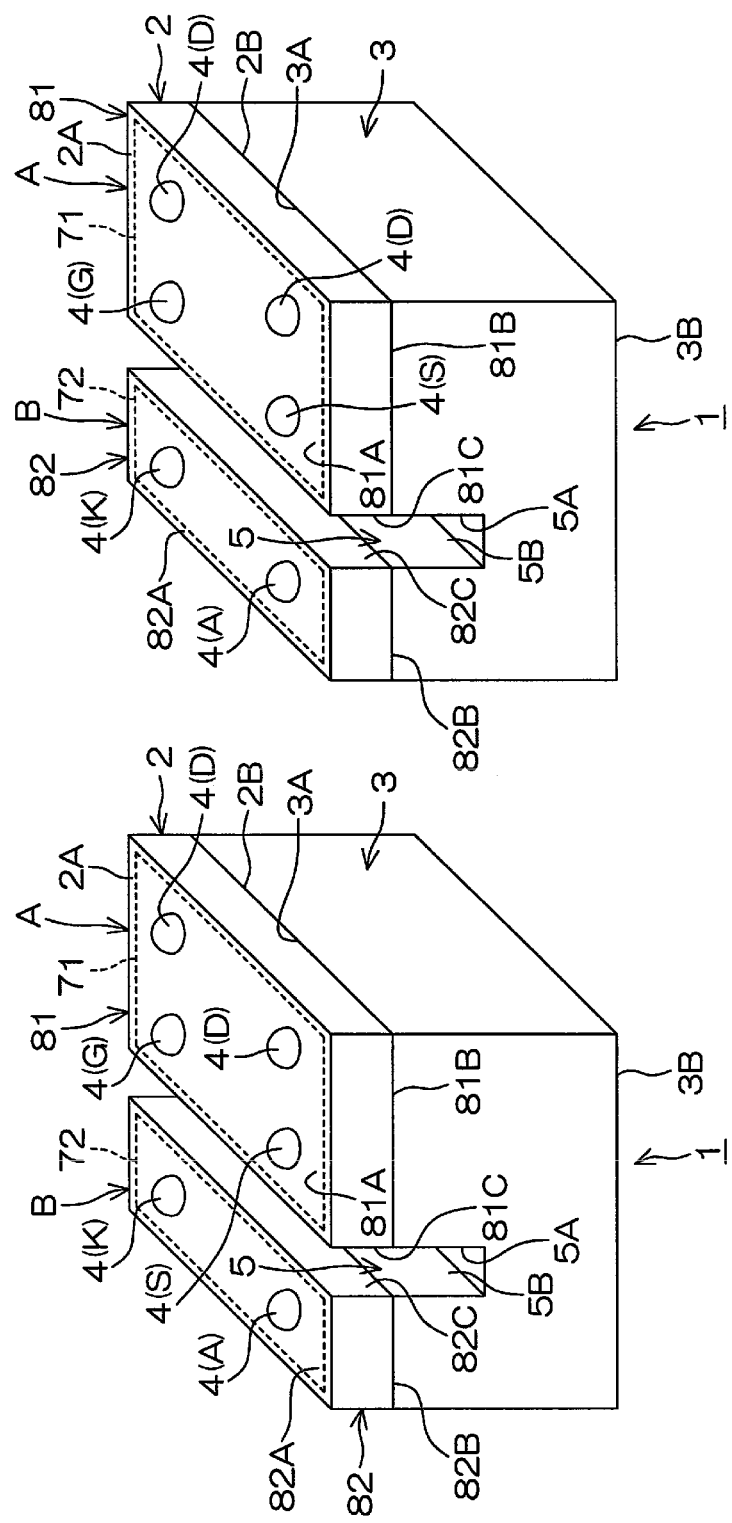
FIG. 7C is a schematic perspective view illustrating a step after the step illustrated in FIG. 7B.

Next, dry etching in which a resist pattern (not shown) is used as a mask is performed to remove the oxide film 38 formed on the exposed surfaces of the gate electrode 20, the source electrode 21 and the anode electrode 40 and to selectively remove the oxide film 38 formed on the rear surface 2A of the semiconductor substrate 2. As illustrated in FIG. 6E, the oxide film 38 remaining after the dry etching forms the sidewall insulating film 23 within the through-hole 14, the sidewall insulating film 24 within the through-hole 15 and the sidewall insulating film 42 within the through-hole 17 (also see FIG. 3).

On the rear surface 2A of the semiconductor substrate 2, the oxide film 38 remaining after the dry etching forms the rear insulating film 27 around the through-hole 14, the rear insulating film 28 around the through-hole 15 and the rear insulating film 44 around the through-hole 17 (also see FIG. 3). The oxide film 38 other than the rear insulating films 27, 28 and 44 is removed from the rear surface 2A and does not exist. The sidewall insulating films 23, 24 and 42 have a thickness of, e.g., about 1.0 µm. The rear insulating films 27, 28 and 44 have a thickness of, e.g., about 1.5 µm.

Next, titanium (or alloy of titanium and copper) is deposited on the rear surface 2A by a sputtering method or a vapor deposition method. At this time, the titanium adheres not only to the rear surface 2A but also to entire areas of the inner circumferential surfaces of the sidewall insulating films 23, 24 and 42 formed within the through-holes 14, 15 and 17. In addition, the titanium adheres to the surface of the gate electrode 20 exposed in the through-hole 14, the surface of the source electrode 21 exposed in the through-hole 15 and the surface of the anode electrode 40 exposed in the through-hole 17.

Next, dry etching in which a resist pattern (not shown) is used as a mask is performed to remove the titanium adhered to the exposed surfaces of the gate electrode 20, the source electrode 21 and the anode electrode 40 and to selectively remove the titanium adhered to the rear surface 2A of the semiconductor substrate 2. As illustrated in FIG. 6E, the titanium remaining after the dry etching forms the connection electrode 25 within the through-hole 14, the connection electrode 26 within the through-hole 15 and the connection electrode 43 within the through-hole 17 (also see FIG. 3).

On the rear surface 2A of the semiconductor substrate 2, the titanium remaining after the dry etching forms the external electrode 29 on the rear insulating film 27 around the through-hole 14, the external electrode 30 on the rear insulating film 28 around the through-hole 15 and the external electrode 45 on the rear insulating film 44 around the through-hole 17 (also see FIG. 3). The titanium remaining after the dry etching also forms the drain electrode 22 on the rear surface 2A. The connection electrodes 25, 26 and 43 have a thickness of, e.g., about 0.5 µm. The external electrodes 29, 30 and 45 and the drain electrode 22 have a thickness of, e.g., about 1.0 μm.

Figure 6F:
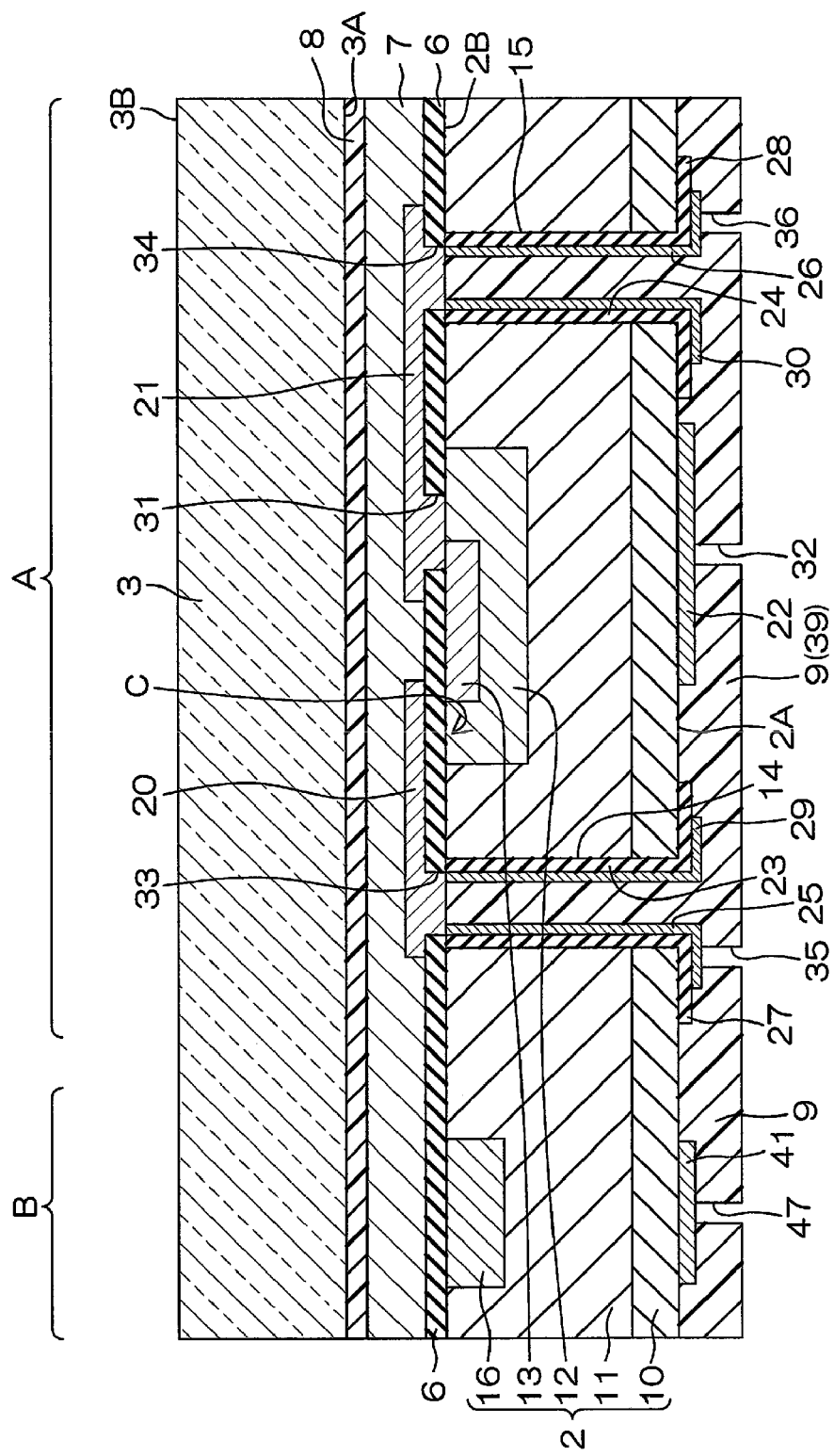
FIG. 6F is a schematic section view illustrating a step after the step illustrated in FIG. 6E.

Next, as illustrated in FIG. 6F, a resin 39 is applied on the rear surface 2A of the semiconductor substrate 2. The resin 39 is, e.g., a photosensitive epoxy-based resin. The resin 39 covers the rear surface 2A and fills the insides of the cylindrical connection electrodes 25, 26 and 43 formed within the through-holes 14, 15 and 17. The resin 39, when cured, becomes the rear insulating layer 9. The rear insulating layer 9 formed on the rear surface 2A has a thickness of, e.g., about 40 μm.

Next, the openings 32, 35, 36, 47 and 49 are formed in the rear insulating layer 9. The terminals 4 are formed to protrude from the openings 32, 35, 36, 47 and 49. As a result, an intermediate product 60 is formed as illustrated in FIG. 7A. At this time, the protruding amount of the respective terminals 4 from the rear surface 2A of through-holes 14 and 15 of semiconductor substrate 2 is, e.g., about 100 μm. The intermediate product 60 as a whole has a thickness of, e.g., about 650 μm.

Two sets of the transistor element 71 and the diode element 72 are incorporated into the intermediate product 60 illustrated in FIG. 7A. In FIG. 7A, the transistor element 71, the diode element 72, the transistor element 71 and the diode element 72 are arranged side by side from the right side in the named order.

The intermediate product 60 illustrated in FIG. 7A is adhered to a support member such as a support tape (not shown) at the side of the support substrate 3, whereby the intermediate product 60 is fixed in position. In the intermediate product 60, a dicing line 62 along which a dicing blade 61 passes to isolate the transistor element 71 and the diode element 72 is set between the transistor element 71 and the diode element 72 of each set adjoining each other. The dicing line 62 is an imaginary line extending rectilinearly between the transistor element 71 and the diode element 72 of each set adjoining each other.

In the intermediate product 60, a dicing line 64 along which a dicing blade 63 (see FIG. 7B) passes to isolate the two sets of the transistor element 71 and the diode element 72 is set between the two sets of the transistor element 71 and the diode element 72. The dicing blades 61 and 63 are disc-shaped grindstones with cutting teeth formed on the outer circumferential surfaces thereof. The thickness of the dicing blade 61 is substantially equal to the width of the isolation groove 5 (see FIG. 7B) and is several tens of μm (more specifically, 20 μm to 40 μm). The dicing blade 63 may be greater in diameter than the dicing blade 61.

As illustrated in FIG. 7A, the dicing blade 61 is moved along the dicing line 62. The dicing blade 61 moves along the dicing line 62 while rotating about the center axis thereof. At this time, the dicing blade 61 digs into the intermediate product 60 at the side of the rear surface of the intermediate product 60 (namely, at the side of the rear surface 2A of the semiconductor substrate 2). The dicing blade 61 passes through the semiconductor substrate 2 in a thickness direction and then reaches an intermediate position of the support substrate 3 in the thickness direction. If the dicing blade 61 is moved to the end of the dicing line 62, the semiconductor substrate 2 is cut between the transistor element 71 and the diode element 72 of each set adjoining each other and the isolation groove 5 is formed on the rear surface 3A of the support substrate 3 between the transistor element 71 and the diode element 72 as illustrated in FIG. 7B. The isolation groove 5 is cut into the support substrate 3 to extend from the rear surface 3A to the intermediate position of the support substrate 3 in the thickness direction. In other words, the isolation groove is formed into the support substrate to extend from the first surface of the support substrate and has a depth less than a depth of the support substrate.

The isolation groove 5 isolates the transistor element 71 and the diode element 72 of each set, thereby forming the first semiconductor chip 81 and the second semiconductor chip 82.

Next, the dicing blade 63 is moved along the dicing line 64. The dicing blade 63 moves along the dicing line 64 while rotating about the center axis thereof. At this time, the dicing blade 63 digs into the intermediate product 60 at the side of the rear surface of the intermediate product 60 (namely, at the side of the rear surface 2A of the semiconductor substrate 2). The dicing blade 63 passes through both the semiconductor substrate 2 and the support substrate 3. If the dicing blade 63 is moved to the end of the dicing line 64, the intermediate product 60 is cut into two pieces and, eventually, two semiconductor devices 1 are diced from the intermediate product 60 as illustrated in FIG. 7C. This dicing operation may be performed by using the dicing blade 61 in place of the dicing blade 63. In this case, an additional isolation groove 5 is formed along the dicing line 64. Thus, the intermediate product 60 is not cut into two pieces and becomes a single semiconductor device as it stands.

In the semiconductor device 1 described above, the first semiconductor chip 81 and the second semiconductor chip 82 are all supported on the support substrate 3. The first semiconductor chip 81 and the second semiconductor chip 82 are provided with the terminals 4 on the first surfaces 81A and 82A opposite to the support substrate 3. Accordingly, the semiconductor device 1 can be flip-chip connected to the mounting wiring substrate 51 by causing the terminals 4 to face the mounting wiring substrate 51 (see FIG. 4).

On the rear surface 3A of the support substrate 3 supporting the first semiconductor chip 81 and the second semiconductor chip 82, there are formed the isolation groove 5 having a pair of side surfaces 5A and 5B continuously extending from mutually-opposing side surfaces 81C and 82C of the first semiconductor chip 81 and the second semiconductor chip 82. The isolation groove 5 is formed through, e.g., a dicing process in which the first semiconductor chip 81 and the second semiconductor chip 82 are diced from a common semiconductor substrate (semiconductor wafer) as illustrated in FIG. 7A. More specifically, the first semiconductor chip 81 and the second semiconductor chip 82 can be isolated from each other by dicing the semiconductor substrate 2 with the dicing blade 61 in a state that the semiconductor substrate 2 is supported on the support substrate 3. At this time, the dicing blade 61 is moved to reach the intermediate position of the support substrate 3 in the thickness direction, thereby forming the isolation groove 5 as illustrated in FIG. 7B.

Referring again to FIG. 7C, the first semiconductor chip 81 and the second semiconductor chip 82 of each of the semiconductor devices 1 are spaced apart from each other by a distance (several tens of μm in the present embodiment) equal to the width of the isolation groove 5 (or the width of the dicing blade 61) and are supported on the support substrate 3 in that state. Accordingly, the first semiconductor chip 81 and the second semiconductor chip 82 are supported on the support substrate 3 in a state that they are reliably isolated from each other by a reduced distance. This makes it possible to mount the first semiconductor chip 81 and the second semiconductor chip 82 to the mounting wiring substrate 51 in an extremely close relationship while keeping them isolated from each other (see FIG. 4). As a consequence, the circuit elements (semiconductor function elements) included in the first semiconductor chip 81 and the second semiconductor chip 82 can be mounted with high density.

Since a plurality of independent semiconductor function elements can be mounted to the mounting wiring substrate 51 at one time by just mounting the semiconductor substrate 2 to the mounting wiring substrate 51, it is possible to simplify the step of mounting the semiconductor function elements to the mounting wiring substrate 51 (see FIG. 4). The semiconductor device 1 has a chip size package shape with the side surfaces of the first semiconductor chip 81 and the second semiconductor chip 82 not encapsulated by a resin. More specifically, a resin for encapsulating the mutually-opposing side surfaces 81C and 82C of the first semiconductor chip 81 and the second semiconductor chip 82 is not provided in the semiconductor device 1.

It is not always necessary that the first semiconductor chip 81 should be the transistor element 71 and the second semiconductor chip 82 should be the diode element 72. The first semiconductor chip 81 and the second semiconductor chip 82 may be any kind of semiconductor element. While one semiconductor device 1 includes two semiconductor chips, namely the first semiconductor chip 81 and the second semiconductor chip 82, in the embodiment described above, one semiconductor device 1 may include three or more semiconductor chips. The size of the respective semiconductor chips in the semiconductor device 1 can be arbitrarily set as the need arises.

Figure 8:
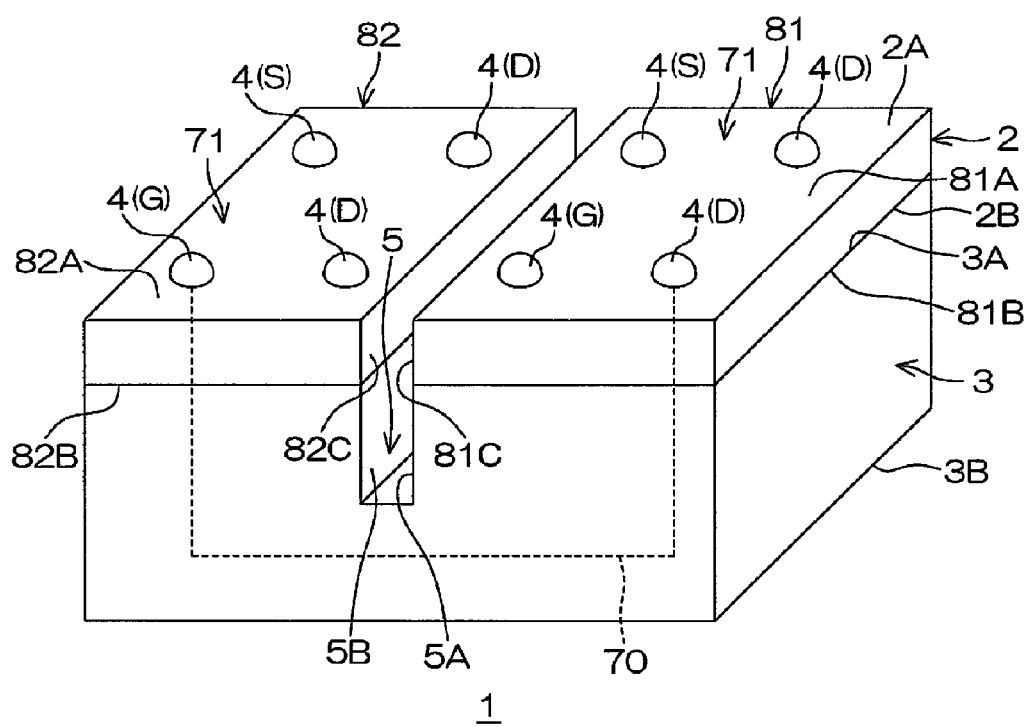
FIG. 8 is a schematic perspective view showing a semiconductor device according to another embodiment of the present disclosure, which makes up a load switch.
Figure 9:
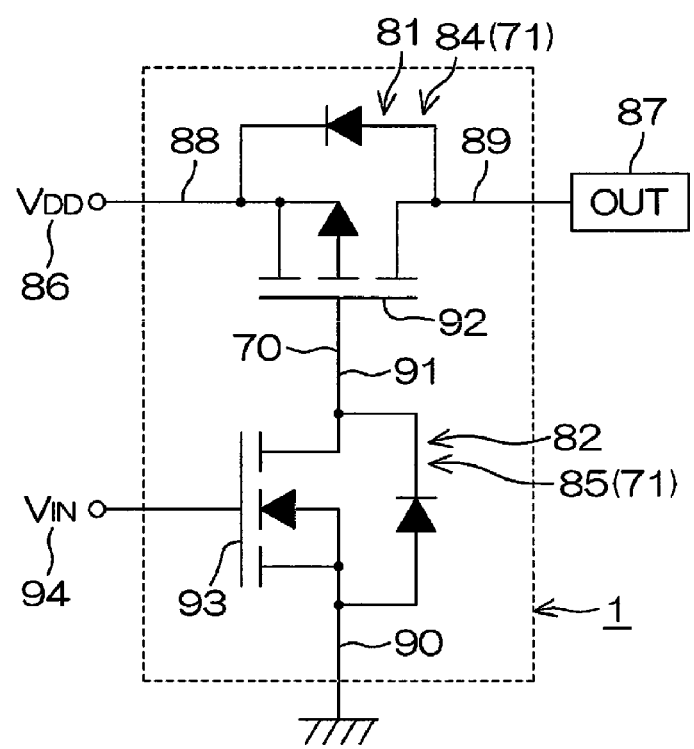
FIG. 9 is an electric circuit diagram showing the electric configuration of the load switch shown in FIG. 8.

FIG. 8 is a schematic perspective view showing a semiconductor device according to another embodiment of the present disclosure, which makes up a load switch. FIG. 9 is an electric circuit diagram showing the electric configuration of the load switch shown in FIG. 8. In the embodiment to be set forth below, the components corresponding to the components of the foregoing embodiment will be designated by like reference symbols and their descriptions will be omitted.

As in the foregoing embodiment, the semiconductor device 1 shown in FIG. 8 includes a first semiconductor chip 81 and a second semiconductor chip 82. In FIG. 8, both the first semiconductor chip 81 and the second semiconductor chip 82 are transistor elements 71. The semiconductor device 1 further includes a wiring line 70 formed within a support substrate 3. The wiring line 70 electrically interconnects the first semiconductor chip 81 and the second semiconductor chip 82 by linking a gate terminal 4(G) of one of the transistor elements 71 and one of drain terminals 4 (D) of the other transistor element 71.

More specifically, as shown in FIG. 9, one of the two transistor elements 71 (semiconductor chips), namely the first semiconductor chip 81, is a p-channel MOSFET (Metal Oxide Semiconductor Field Effect Transistor) 84. The other transistor element 71, namely the second semiconductor chip 82, is an n-channel MOSFET 85. The p-channel MOSFET 84 is connected between a power supply ($V_{DD}$) 86 and a load (OUT) 87. The n-channel MOSFET 85 is connected to the p-channel MOSFET 84.

In the p-channel MOSFET 84, a source 88 is connected to the power supply ($V_{DD}$) 86 and a drain 89 is connected to the load (OUT) 87. In the n-channel MOSFET 85, a source 90 is grounded and a drain 91 is connected to a gate 92 of the p-channel MOSFET 84 through the wiring line 70. The semiconductor device 1 makes up a load switch. A control signal is inputted from an input terminal ($V_{IN}$) 94 to a gate 93 of the n-channel MOSFET 85. Thus, the n-channel MOSFET 85 and the p-channel MOSFET 84 are turned on, allowing an electric current to flow from the power supply 86 to the load 87.

In the semiconductor device 1, the first semiconductor chip 81 and the second semiconductor chip 82 can be electrically connected to each other by the wiring line 70 (see FIG. 8) arranged within the support substrate 3. The wiring line 70 can be designed regardless of the structure of a semiconductor wafer used in manufacturing the first semiconductor chip 81 and the second semiconductor chip 82. This enables free connection of the first semiconductor chip 81 and the second semiconductor chip 82. More specifically, if the transistor elements 71 each having a collector, an emitter and a base are respectively formed in the first semiconductor chip 81 and the second semiconductor chip 82, it is possible to make a connection, e.g., between the collectors, between the emitters, between the collector and the emitter and between the collector and the base. Similarly, if the transistor elements 71 each having a drain, a source and a gate are respectively formed in the first semiconductor chip 81 and the second semiconductor chip 82, it is possible to make a connection, e.g., between the drains, between the sources, between the drain and the source and between the drain and the gate.

If the wiring line 70 for electrically interconnecting the first semiconductor chip 81 and the second semiconductor chip 82 is formed within the support substrate 3 as stated above, there is no need to arrange a wiring line (e.g., the connection wiring line 57 or 58 shown in FIG. 4) having the same function as the wiring line 70 within the mounting wiring substrate 51.

Figure 10:
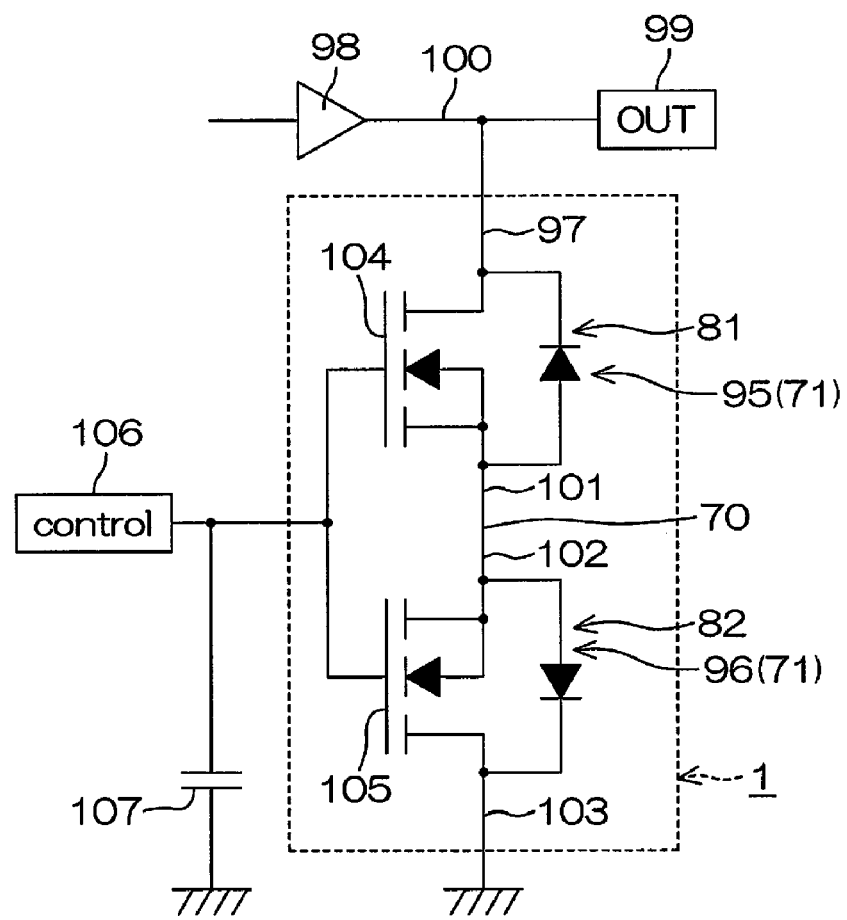
FIG. 10 is an electric circuit diagram showing the electric configuration of a muting unit according to a further embodiment of the present disclosure.

Next, description will be made with respect to a semiconductor device 1 including two transistor elements 71 (semiconductor chips) in place of the load switch described above. FIG. 10 is an electric circuit diagram showing the electric configuration of a muting unit according to a further embodiment of the present disclosure. Referring to FIG. 10, two transistor elements 71 are all formed of n-channel MOSFETs 95 and 96. The n-channel MOSFETs 95 and 96 are serially connected to each other in an opposite orientation. The n-channel MOSFET 95 makes up a first semiconductor chip 81 and the n-channel MOSFET 96 makes up a second semiconductor chip 82.

In the n-channel MOSFET 95, a drain 97 is connected to an output line 100 linking a voice amplifier 98 and a speaker (OUT) 99. A source 101 of the n-channel MOSFET 95 is connected to a source 102 of the n-channel MOSFET 96 through a wiring line 70. A drain 103 of the n-channel MOSFET 96 is grounded. A control unit 106 is connected to gates 104 and 105 of the n-channel MOSFETs 95 and 96. One end of a capacitor 107 is connected between the gates 104 and 105 of the n-channel MOSFETs 95 and 96 and the control unit 106. The other end of the capacitor 107 is grounded.

The semiconductor device 1 stated above makes up a muting unit. If the control unit 106 inputs a control signal to the gates 104 and 105 of the n-channel MOSFETs 95 and 96, the re-channel MOSFETs 95 and 96 are turned on. In this case, a voice signal fed from the voice amplifier 98 flows toward the n-channel MOSFETs 95 and 96 but does not reach the speaker 99, thereby performing a muting operation.

For example, if a noise is contained in the voice signal coming from the voice amplifier 98, the control unit 106 turns on the n-channel MOSFETs 95 and 96 to perform a muting operation, thereby preventing the speaker 99 from outputting a noise sound.

Figure 11:
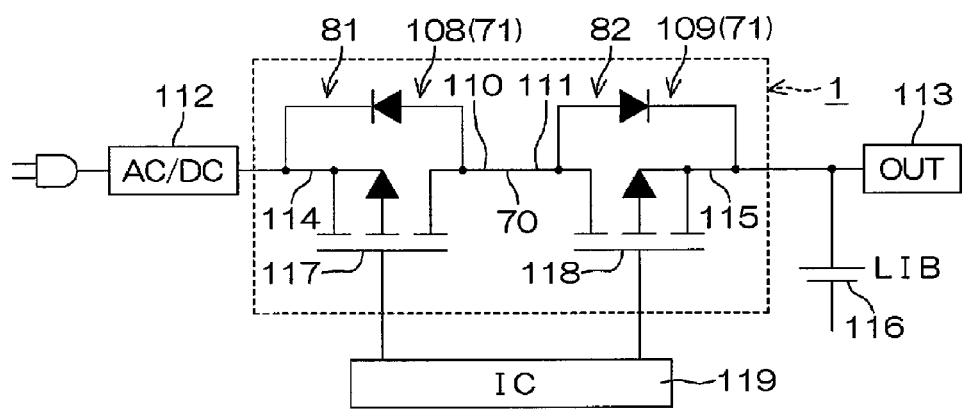
FIG. 11 is an electric circuit diagram showing the electric configuration of a charging control switch according to a still further embodiment of the present disclosure.

FIG. 11 is an electric circuit diagram showing the electric configuration of a charging control switch according to a still further embodiment of the present disclosure. Referring to FIG. 11, two transistor elements 71 are all formed of p-channel MOSFETs 108 and 109. The p-channel MOSFETs 108 and 109 are serially connected to each other in an opposite orientation. The p-channel MOSFET 108 makes up a first semiconductor chip 81 and the p-channel MOSFET 109 makes up a second semiconductor chip 82. In the p-channel MOSFETs 108 and 109, drains 110 and 111 are connected to each other through a wiring line 70. The p-channel MOSFETs 108 and 109 are connected between a power supply side AC/DC converter 112 and a load (OUT) 113. A source 114 of the p-channel MOSFET 108 is connected to the AC/DC converter 112 and a source 115 of the p-channel MOSFET 109 is connected to the load 113. A battery (LIB) 116 is connected between the source 115 of the p-channel MOSFET 109 and the load 113. A control unit (IC) 119 is connected to gates 117 and 118 of the p-channel MOSFETs 108 and 109.

If the control unit 119 inputs a control signal to the gates 117 and 118 of the p-channel MOSFETs 108 and 109, the p-channel MOSFETs 108 and 109 are turned on. In this case, an electric current flows from a power supply to the load 113, charging the battery 116. Since the p-channel MOSFETs 108 and 109 are serially connected to each other in an opposite orientation, there is no possibility that an electric current flows back to the power supply during a charging process.

If the charging of the battery 116 comes to an end, the control unit 119 stops outputting the control signal to the gates 117 and 118, thereby turning off the p-channel MOSFETs 108 and 109. Thus, no electric current flows from the power supply to the load 113.

While certain embodiments have been described, these embodiments have been presented by way of example only, and are not intended to limit the scope of the disclosures. Indeed, the novel semiconductor devices and the novel methods of manufacturing the same described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, the method comprising:
    providing a semiconductor substrate having a first surface and a second surface and a support substrate having a first surface and bonding the second surface of the semiconductor substrate to the first surface of the support substrate; and
    cutting the semiconductor substrate from the first surface of the semiconductor substrate and forming an isolation groove into the first surface of the support substrate,
    wherein the isolation groove is formed to extend from the first surface of the support substrate into the support substrate and has a predetermined depth less than a thickness of the support substrate, and
    wherein providing the semiconductor substrate further comprises:
        forming an oxide film configured to cover an entire area of the second surface of the semiconductor substrate;
        forming a protective layer configured to cover the oxide film; and
        forming a bonding layer formed between the protective layer and the support substrate.

2. The method claim 1, wherein cutting the semiconductor substrate is performed using a dicing blade.

3. The method of claim 1, wherein after the semiconductor substrate is cut, the semiconductor substrate is separated into a first semiconductor chip and a second semiconductor chip with respect to the isolation groove, and
    wherein the second surface of the semiconductor substrate includes a first surface of the first semiconductor chip and a first surface of the second semiconductor chip, and the first surface of the semiconductor substrate includes a second surface of the first semiconductor chip and a second surface of the second semiconductor chip.

4. The method of claim 3, wherein providing the semiconductor substrate comprises forming a wiring line within the support substrate, wherein the wiring line electrically connects the first semiconductor chip to the second semiconductor chip.

5. The method of claim 3, wherein on the second surface of the first semiconductor chip, a first terminal of the first semiconductor chip is arranged, and on the second surface of the second semiconductor chip, a first terminal of the second semiconductor chip is arranged.

6. The method of claim 5, wherein a first electrode and a control electrode are arranged on the second surface of the first semiconductor chip.

7. The method of claim 6, wherein providing the semiconductor substrate further comprises:
    forming the semiconductor substrate of a first conductive type;
    forming a first semiconductor layer of a second conductive type on the semiconductor substrate; and forming a second semiconductor layer formed in a surface layer portion of the first semiconductor layer, and
    wherein the semiconductor substrate of a first conductive type, the first semiconductor layer of a second conductive type, and the second semiconductor layer are formed for the first semiconductor chip, and wherein the first electrode is in contact with the first semiconductor layer and the second semiconductor layer.

8. The method of claim 7, wherein providing the semiconductor substrate further comprises:
    forming a second terminal and a third terminal; and
    forming at least two through-holes that pass through the semiconductor substrate, and
    wherein the second terminal, the third terminal, the at least two through-holes are formed for the first semiconductor chip, and
    wherein the first electrode is electrically connected to the second terminal via one of the at least two through-holes, and the control electrode is electrically connected to the third terminal via the other of the at least two through-holes.

9. The method of claim 8, wherein forming the at least two through-holes comprises filling at least one of the at least two through-holes with an insulating material.

10. The method of claim 8, wherein providing the semiconductor substrate comprises forming a side wall insulating film over the entire area of an inner surface defining one of the at least two through-holes.

11. The method of claim 8, wherein providing the semiconductor substrate comprises:
    forming a cylindrical side wall insulating film over the entire area of an inner surface defining one of the at least two through-holes having a circular opening smaller in a cross section than one of at least two through-holes in an oxide film connected to one end of the side wall insulating film.

12. The method of claim 10, wherein a connection electrode is formed over the entire area of an inner circumferential surface of the side wall insulating film for the first semiconductor chip.

13. The method of claim 10, wherein a rear insulating film is connected to the sidewall insulating film for the first semiconductor chip.

14. The method of claim 12, wherein providing the semiconductor substrate comprises:
forming a rear insulating film on a portion of the first surface of the semiconductor substrate;
forming an external electrode on the rear insulating film; and
forming a rear insulating layer covering the first surface of the semiconductor substrate, at least a portion of the rear insulating film, and at least a portion of the external electrode,
wherein the external electrode is connected to the connection electrode for the first semiconductor chip, and
wherein the external electrode is interposed between the rear insulating film and a rear insulating layer.

15. The method of claim 3, wherein after cutting the semiconductor substrate, the oxide film, the protective layer, and the bonding layer are formed on the first surface of the first semiconductor chip and the first surface of the second semiconductor chip.

16. The method of claim 3, wherein providing the semiconductor substrate further comprises:
forming a rear insulating layer on the first surface of the semiconductor substrate, and
wherein after cutting the semiconductor substrate, the rear insulating layer is formed on the second surfaces of the first semiconductor chip and the second semiconductor chip.

17. The method of claim 3, wherein providing the semiconductor substrate further comprises:
forming a through-hole configured to pass through the semiconductor substrate; and
filling the through-hole with an insulating material,
wherein the through-hole is formed for the first semiconductor chip, and
wherein the semiconductor substrate is of a first conductive type and the insulating material of the through-hole is the same material as a rear insulating layer.

18. A method of manufacturing a semiconductor device, the method comprising:
providing a semiconductor substrate having a first surface and a second surface and a support substrate having a first surface and bonding the second surface of the semiconductor substrate to the first surface of the support substrate; and
cutting through the first surface of the semiconductor substrate to form an isolation groove on the first surface of the support substrate to a depth less than the thickness of the support substrate, the first surface of the support substrate bonded to a second surface of the semiconductor substrate,
wherein providing the semiconductor substrate further comprises:
forming an oxide film configured to cover an entire area of the second surface of the semiconductor substrate;
forming a protective layer configured to cover the oxide film; and
forming a bonding layer formed between the protective layer and the support substrate.

19. The method of claim 18, further comprising forming a wiring line within the support substrate.

20. The method claim 18, wherein cutting through a first surface of a semiconductor substrate is performed using a dicing blade.

* * * * *